(12) United States Patent
Hudson et al.

(10) Patent No.: US 12,479,004 B2
(45) Date of Patent: Nov. 25, 2025

(54) SELECTIVE ATTACHMENT TO ENHANCE $SiO_2:SiN_x$ ETCH SELECTIVITY

(71) Applicant: Lam Research Corporation, Fremont, CA (US)

(72) Inventors: Eric A. Hudson, Berkeley, CA (US);
Chia-Chun Wang, Fremont, CA (US);
Sumit Agarwal, Arvada, CO (US);
Ryan James Gasvoda, Golden, CO (US)

(73) Assignee: Lam Research Corporation, Fremont, CA (US)

( * ) Notice: Subject to any disclaimer, the term of this patent is extended or adjusted under 35 U.S.C. 154(b) by 551 days.

(21) Appl. No.: 17/754,020

(22) PCT Filed: Oct. 15, 2020

(86) PCT No.: PCT/US2020/055767
§ 371 (c)(1),
(2) Date: Mar. 21, 2022

(87) PCT Pub. No.: WO2021/076746
PCT Pub. Date: Apr. 22, 2021

(65) Prior Publication Data
US 2022/0362803 A1 Nov. 17, 2022

Related U.S. Application Data

(60) Provisional application No. 62/923,188, filed on Oct. 18, 2019.

(51) Int. Cl.
*B05D 1/00* (2006.01)
*B05D 3/00* (2006.01)
*B05D 3/14* (2006.01)

(52) U.S. Cl.
CPC ............. *B05D 1/60* (2013.01); *B05D 3/002* (2013.01); *B05D 3/145* (2013.01); *B05D 2203/30* (2013.01)

(58) Field of Classification Search
CPC .......... B05D 1/60; B05D 3/002; B05D 3/145; B05D 2203/30; H01L 21/3105;
(Continued)

(56) References Cited

U.S. PATENT DOCUMENTS 4,636,834 A  1/1987  Shepard
5,459,099 A  10/1995 Hsu
(Continued)

FOREIGN PATENT DOCUMENTS

JP  2013062278 A  4/2013
KR  20170093080 A  8/2017
(Continued)

OTHER PUBLICATIONS

C. M. Huard et al., J. Vac. Sci. Technol. A 36, 06B101 (2018).
(Continued)

*Primary Examiner* — Joshua L Allen
*Assistant Examiner* — Christopher Remavege
(74) *Attorney, Agent, or Firm* — Weaver Austin Villeneuve & Sampson LLP

(57) ABSTRACT

Methods and apparatuses for selectively etching silicon-and-oxygen-containing material relative to silicon-and-nitrogen-containing material by selectively forming a carbon-containing self-assembled monolayer on a silicon-and-nitrogen-containing material relative to a silicon-and-oxygen-containing material are provided herein. Methods are also applicable to selectively etching silicon-and-nitrogen-containing material relative to silicon-and-oxygen-containing material.

24 Claims, 18 Drawing Sheets

(58) Field of Classification Search
CPC ......... H01L 21/76897; H01L 21/31116; H01L 21/31144; H01L 21/0214; H01L 21/02164; H01L 21/0217

See application file for complete search history.

(56) References Cited

U.S. PATENT DOCUMENTS

| | | | |
|---|---|---|---|
| 5,658,830 | A | 8/1997 | Jeng |
| 5,891,805 | A | 4/1999 | Cheng et al. |
| 7,732,728 | B2 | 6/2010 | Dhindsa et al. |
| 7,740,736 | B2 | 6/2010 | Fischer et al. |
| 8,546,264 | B2 | 10/2013 | Olynick et al. |
| 8,808,561 | B2 | 8/2014 | Kanarik |
| 8,883,028 | B2 | 11/2014 | Kanarik |
| 9,875,907 | B2 * | 1/2018 | Wang ................. H01L 21/31116 |
| 2006/0108576 | A1 * | 5/2006 | Laermer ........... H01L 21/02337 257/E21.279 |
| 2008/0064214 | A1 * | 3/2008 | Han ..................... H01L 21/3105 257/E21.241 |
| 2009/0081876 | A1 | 3/2009 | Bera et al. |
| 2011/0006406 | A1 * | 1/2011 | Urbanowicz ............ C23C 16/56 257/632 |
| 2014/0170853 | A1 | 6/2014 | Shamma et al. |
| 2017/0148640 | A1 * | 5/2017 | Wang .................. H01L 21/3105 |
| 2017/0148642 | A1 * | 5/2017 | Wang ................. H01L 21/31144 |
| 2017/0229314 | A1 * | 8/2017 | Tan ........................ H01J 37/321 |
| 2019/0189462 | A1 * | 6/2019 | Hudson ............... H01L 21/3065 |
| 2019/0210061 | A1 * | 7/2019 | Ke ........................... H01L 21/321 |
| 2019/0378725 | A1 * | 12/2019 | Abatchev .......... H01L 21/28194 |
| 2020/0066539 | A1 * | 2/2020 | Pearlstein ............. C23C 16/405 |

FOREIGN PATENT DOCUMENTS

| | | |
|---|---|---|
| KR | 20180072838 A | 6/2018 |
| WO | WO-2017087138 A1 | 5/2017 |
| WO | WO-2021076746 A1 | 4/2021 |

OTHER PUBLICATIONS

Carver, C.T et al., "Atomic Layer Etching: An Industry Perspective," ECS Journal of Solid State Science and Technology, vol. 4, No. 6, Feb. 20, 2015, pp. N5005-N5009.

International Search Report and Written Opinion dated Feb. 3, 2021 in PCT Application PCT/US2020/055767.

K. J. Kanarik et al., J. Vac. Sci. Technol. A 33, 020802 (2015).

R. J. Gasvoda et al., Gas Phase Organic Functionalization of SiO2 with Propanoyl Chloride Langmuir, 34, 14489-14497 (2018).

R. J. Gasvoda et al., J. Vac. Sci. Technol. A 37, 051003 (2019).

R. J. Gasvoda et al., Surface Pre-functionalization of SiNx to Enhance Selectivity in Plasma-Assisted Atomic Layer Etching, Colorado School of Mines, (2019).

PCT International Preliminary Report on Patentability dated Apr. 28, 2022 issued in PCT/US2020/055767.

TW Office Action dated Mar. 12, 2024 in Application No. TW109135855 with English Translation.

TW Office Action dated Oct. 9, 2024 in TW Application No. 109135855 with English translation.

KR Office Action dated Jan. 7, 2025 in KR Application No. 10-2022-7016725, with English Translation.

KR Decision for Grant and Search Report dated Aug. 25, 2025 in KR Application No. 10-2022-7016725, with English translation.

* cited by examiner

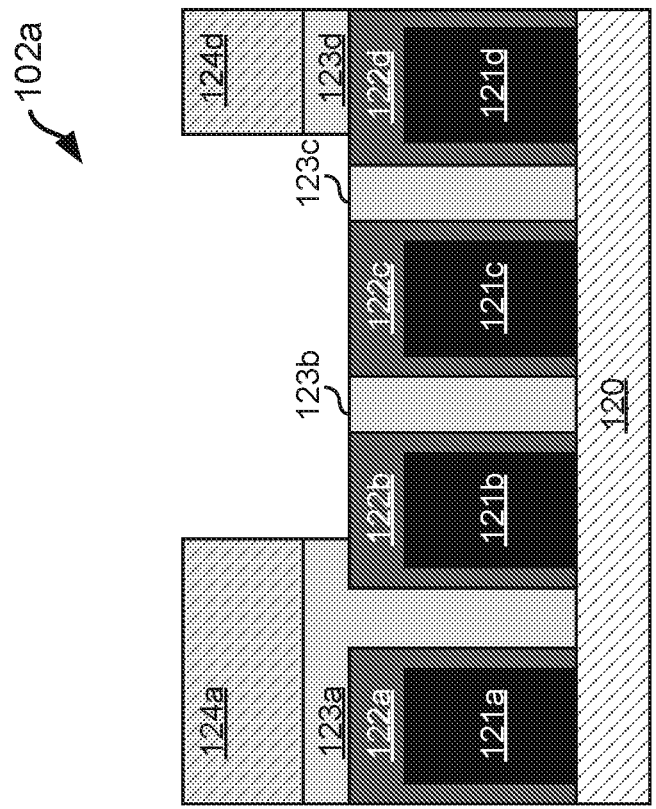
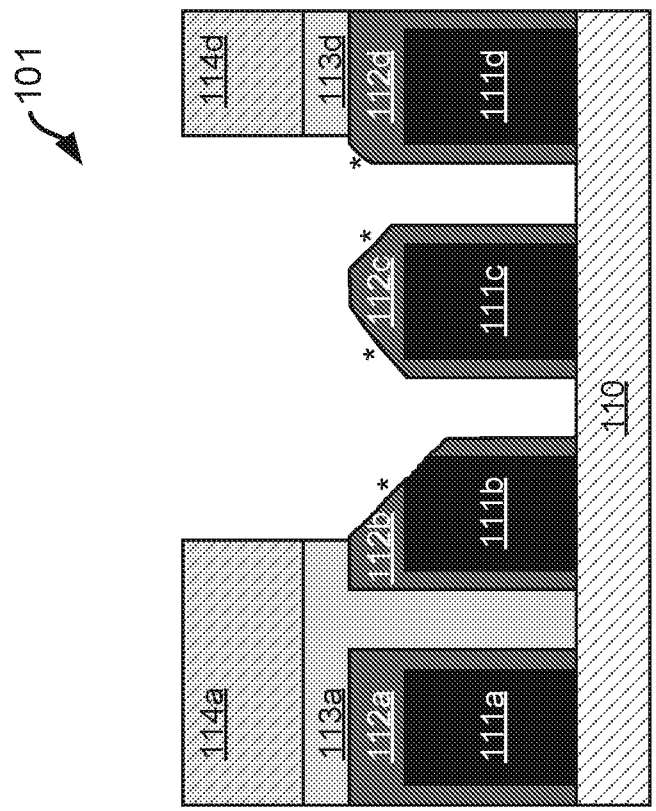
FIG. 1B
FIG. 1A

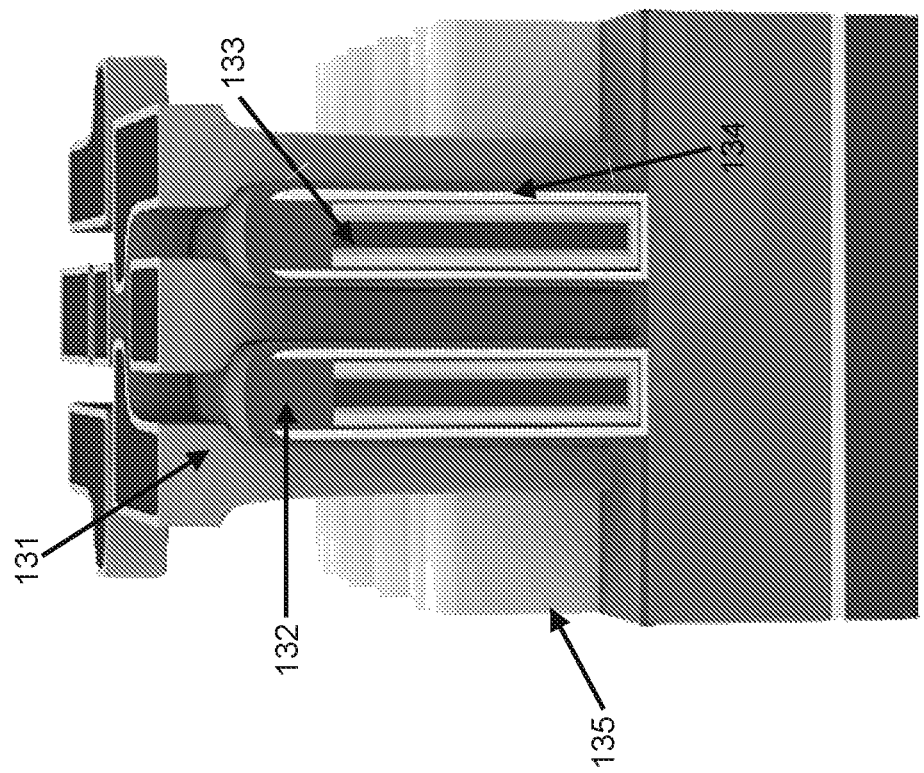

SELECTIVE ATTACHMENT TO ENHANCE SiO$_2$:SiN$_x$ ETCH SELECTIVITY

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in their entireties and for all purposes.

FIELD

This disclosure relates generally to the field of semiconductor processing. In particular aspects, the disclosure relates to use of a self-assembled monolayer precursor.

BACKGROUND

Semiconductor fabrication processes involve patterning and fabrication of complex structures such as self-aligned contacts that may include etching a silicon-containing material relative to another silicon-containing material. As devices shrink, etching such materials with high selectivity becomes a challenge.

The background description provided herein is for the purposes of generally presenting the context of the disclosure. Work of the presently named inventors, to the extent it is described in this background section, as well as aspects of the description that may not otherwise qualify as prior art at the time of filing, do not constitute express or implied prior art against the present disclosure.

SUMMARY

The present disclosure relates to use of a carbon-containing self-assembled monolayer (SAM) precursor to selectively attached to a particular surface. In one embodiment, the SAM precursor selectively attaches to the silicon-and-nitrogen-containing surface, as compared to a silicon-and-oxygen-containing surface. In another embodiment, the SAM precursor selectively attaches to the silicon-and-oxygen-containing surface, as compared to a silicon-and-nitrogen-containing surface. In this way, the SAM precursor can provide a functionalized, protected surface.

Accordingly, in one aspect, the present disclosure encompasses a method for processing substrates including: providing a substrate having a silicon-and-nitrogen-containing surface and a silicon-and-oxygen-containing surface; exposing the substrate to a carbon-containing SAM precursor to form a protected surface and a non-functionalized surface; and exposing the substrate including the protected surface to a process for etching the non-functionalized surface.

In some embodiments, said exposing the substrate to the carbon-containing SAM precursor includes use of a non-plasma environment. In other embodiments, the carbon-containing SAM precursor selectively attaches to the silicon-and-nitrogen-containing surface to form the protected silicon-and-nitrogen-containing surface, in which the non-functionalized surface then includes a non-functionalized silicon-and-oxygen-containing surface. In yet other embodiments, the carbon-containing SAM precursor selectively attaches to the silicon-and-oxygen-containing surface to form the protected silicon-and-oxygen-containing surface, in which the non-functionalized surface then includes a non-functionalized silicon-and-nitrogen-containing surface.

In some embodiments, the method further includes: repeating exposing the substrate to the carbon-containing SAM precursor after exposing the substrate to the process for etching the non-functionalized surface. Such repeating can include use of cycles or can be performed in temporally separated alternating pulses.

In some embodiments, exposing the substrate to the process for etching the non-functionalized surface includes performing atomic layer etching and/or continuous etching. In other embodiments, exposing the substrate to the process for etching the non-functionalized surface includes: (i) exposing the substrate to a plasma reactive species generated from a fluorocarbon plasma to form a reactive layer; and (ii) exposing the substrate to an activation plasma to remove the reactive layer. Such exposing in (i) and (ii) can be repeated (e.g., in cycles) or performed in temporally separated alternating pulses. The fluorocarbon plasma can be generated from a fluorocarbon selected from C$_4$F$_6$, C$_4$F$_8$, a perfluorocarbon, a fluorohydrocarbon, and combinations thereof. The activation plasma can be generated from an inert gas, such as argon or helium.

In some embodiments, exposing the substrate to the carbon-containing SAM precursor is performed at a wafer temperature between about −40° C. and about 550° C.; and/or with a dose between about 0.1 ML and about 500 ML.

In some embodiments, exposing the substrate to the carbon-containing SAM precursor and the exposing the substrate to the process are performed without breaking vacuum. In other embodiments, the exposing the substrate to the carbon-containing SAM precursor and exposing the substrate to the process are performed in the same reactor. In particular embodiments, the process includes introducing a fluorocarbon plasma.

In some embodiments, the method further includes (e.g., prior to exposing the substrate to the carbon-containing SAM precursor): exposing the substrate to a treatment gas in a plasma environment. Non-limiting treatment gas includes argon, nitrogen, hydrogen, helium, and combinations thereof. In particular embodiments, exposing the substrate to the treatment gas in the plasma environment includes applying a radio frequency (RF) bias (e.g., such as RF bias powered between 5 W and 150 W).

In some embodiments, the silicon-and-nitrogen-containing surface includes a first sidewall surface, the silicon-and-oxygen-containing surface includes a second sidewall surface, and the protected surface includes a protected sidewall surface. In particular embodiments, the protected sidewall surface includes the first sidewall surface, thereby providing a protected first sidewall surface. In some embodiments, the process for etching includes vertical etching through a feature including the first sidewall surface and the second sidewall surface. In further embodiments, said vertical etching is conducted in the presence of the protected first sidewall surface and a non-functionalized second sidewall surface (e.g., including a non-functionalized second sidewall surface). In other embodiments, the feature has an aspect ratio of at least about 20:1.

In a second aspect, the present disclosure features an apparatus for processing substrates. In some embodiments, the apparatus includes: at least one reactor, each of the at least one reactor including a chuck or a pedestal; one or more gas inlets into the at least one reactor and flow-control hardware; and a controller having at least one processor and a memory. In other embodiment, at least one processor and the memory are communicatively connected with one another, at least one processor is at least operatively connected with the flow-control hardware, and the memory stores computer-executable instructions for controlling the at least one processor to at least control the flow-control hardware to perform any method herein. In particular embodiments, the computer-executable instructions include instructions for controlling the at least one processor to at least control the flow-control hardware to: cause formation of a carbon-containing SAM on a substrate to form both a protected surface and a non-functionalized surface on the substrate; and cause etching of the non-functionalized surface on the substrate, as compared to the protected surface. In some embodiment, the etching includes atomic layer etch and/or continuous etch. In other embodiments, the protected surface includes a protected silicon-and-nitrogen-containing surface, and the non-functionalized surface includes a non-functionalized silicon-and-oxygen-containing surface. In particular embodiments, the protected surface includes a protected silicon-and-oxygen-containing surface, and the non-functionalized surface includes a non-functionalized silicon-and-nitrogen-containing surface In some embodiments, the memory stores computer-executable instructions for causing the formation of the carbon-containing SAM and for causing etching of the non-functionalized surface to be performed without breaking vacuum.

In a third aspect, the present disclosure features another method for processing substrates. In some embodiments, the method includes: providing a substrate having a feature, the feature including a silicon-and-nitrogen-containing sidewall surface and a silicon-and-oxygen-containing sidewall surface; exposing the substrate to a carbon-containing SAM precursor in a non-plasma environment to form a protected sidewall surface (e.g., a protected silicon-and-nitrogen-containing sidewall surface or a protected silicon-and-oxygen-containing sidewall surface); and exposing the substrate including the protected sidewall surface to a process for vertical etching (e.g., through the feature). In some embodiments, the feature has an aspect ratio of at least about 20:1.

In some embodiments, exposing the substrate to a carbon-containing SAM precursor includes a non-plasma environment. In other embodiments, the carbon-containing SAM precursor selectively attaches to the silicon-and-nitrogen-containing sidewall surface to form the protected silicon-and-nitrogen-containing sidewall surface. In yet other embodiments, the carbon-containing SAM precursor selectively attaches to the silicon-and-oxygen-containing sidewall surface to form the protected silicon-and-oxygen-containing sidewall surface.

In any embodiment herein, etching includes atomic layer etching and/or continuous etching.

In any embodiment herein, the fluorocarbon plasma is generated from a fluorocarbon selected from $C_4F_6$, $C_4F_8$, a perfluorocarbon, a fluorohydrocarbon, and combinations thereof. The fluorocarbon plasma can optionally include argon.

In any embodiment herein, the activation plasma includes argon, helium, or another inert gas.

In any embodiment herein, the carbon-containing SAM precursor includes a head group having greater reactivity with the silicon-and-nitrogen-containing surface relative to the silicon-and-oxygen-containing surface. Non-limiting SAM precursors include aldehydes, including 1-hexanal, 3,5,5-trimethylhexanal, benzaldehyde, and derivatives of benzaldehyde with one or more fluorine atoms substituted for hydrogen atoms; ketones; and isothiocyanates, including phenyl isothiocyanate and hexyl isothiocyanate.

In any embodiment herein, the carbon-containing SAM precursor includes a head group having greater reactivity with the silicon-and-oxygen-containing surface relative to the silicon-and-nitrogen-containing surface. Non-limiting SAM precursors include silanes, oxysilanes, cyclic azasilanes, or cyclic thiosilanes.

In any embodiment herein, the carbon-containing SAM precursor includes: $R^1$—C(O)—$R^2$ or $R^1$—NCS, wherein $R^1$ includes an organic moiety, and wherein $R^2$ is hydrogen (H) or includes an organic moiety, in which $R^1$ and $R^2$ can be the same or different. In some embodiments, $R^2$ is H. In other embodiments, each of $R^1$ and/or $R^2$ is or includes, independently, optionally substituted aliphatic, optionally substituted heteroaliphatic, optionally substituted cycloaliphatic, optionally substituted cycloheteroaliphatic, or optionally substituted aromatic. In yet other embodiments, $R^1$ includes a branched-chain hydrocarbon, a linear hydrocarbon, or an aromatic. In particular embodiments, $R^1$ includes one or more halo substitutions or one or more haloalkyl substitutions.

In any embodiment herein, the carbon-containing SAM precursor includes: $SiR^3R^4R^5R^6$ or

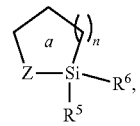

wherein Z can be —S—, —O—, or —$NR^7$—; wherein each of $R^3$, $R^4$, $R^5$, $R^6$, and $R^7$ is or includes, independently, H, halo, or an organic moiety; wherein ring a can be optionally substituted; and wherein n is an integer from 1 to 5. Additional carbon-and-silicon-containing SAM precursors are described herein.

In any embodiment herein, the carbon-containing SAM precursor includes an organometallic precursor, an organometalloid precursor, or an organoselenium precursor, such as any described herein. In some embodiments, the organometallic precursor, the organometalloid precursor, or the organoselenium precursor further includes an aldehyde functional group, a ketone functional group, an isothiocyanate functional group, or a silane functional group. In other embodiments, the precursor includes any of the following atoms: titanium (Ti), molybdenum (Mo), gallium (Ga), indium (In), tin (Sn), silicon (Si), germanium (Ge), arsenic (As), antimony (Sb), tellurium (Te), or selenium (Se).

In any embodiment herein, the protected silicon-and-nitrogen-containing surface prevents activation of the silicon-and-nitrogen-containing surface when exposed to argon plasma. Non-limiting silicon-and-nitrogen-containing surface includes material selected silicon oxynitride, silicon carbonitride, hydrogen-terminated silicon nitride, dopant versions thereof, and combinations thereof. In some embodiments, the silicon-and-nitrogen-containing surface includes —NHx groups. In other embodiments, the silicon-and-nitrogen-containing surface includes a dopant selected from the group consisting of boron, phosphorous, and combinations thereof.

In any embodiment herein, the silicon-and-oxygen-containing surface can be porous or non-porous. In particular embodiments, the silicon-and-oxygen-containing surface includes a low-k dielectric.

BRIEF DESCRIPTION OF THE DRAWINGS

FIG. 1A-1C shows example schematic illustrations of substrates including (A) a non-limiting substrate 101 having an etch stop layer (Fin/STI) 110, gate stacks 111a/b/c/d, silicon nitride 112a/b/c/d, silicon oxide 113a/d, and a photomask 114a/d; (B) another non-limiting substrate 102a having an etch stop layer (Fin/STI) 120, gate stacks 121a/b/c/d, silicon nitride 122a/b/c/d, silicon oxide 123a/d, and a photomask 124a/d; and (C) a further non-limiting substrate 102b.

DETAILED DESCRIPTION

Figure 2A:
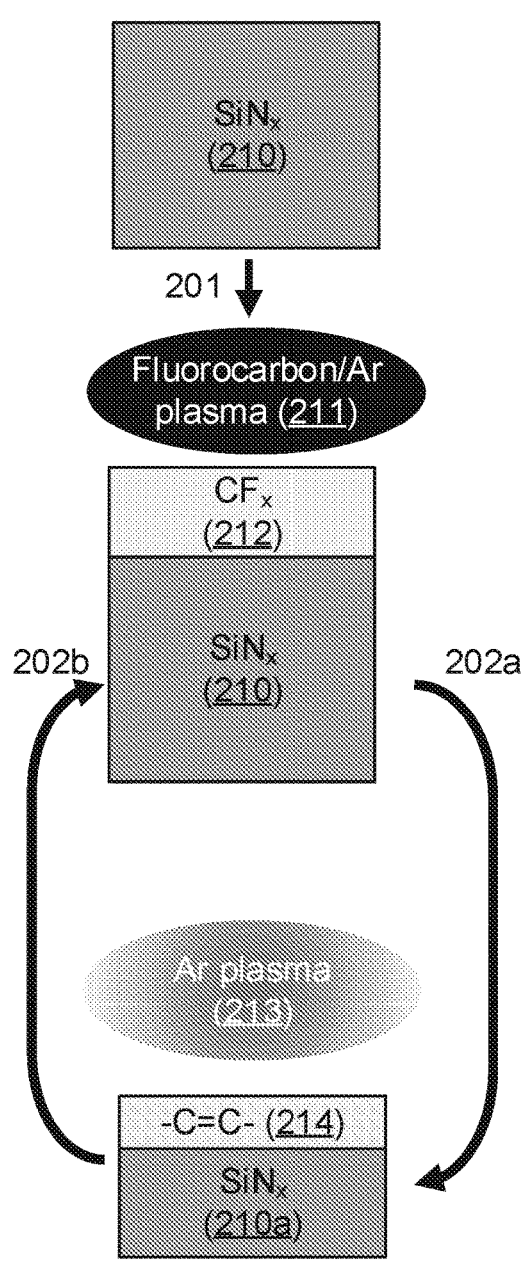
FIG. 2A-2C shows schematic illustrations of substrates having (A) non-functionalized silicon nitride surfaces; (B) functionalized, protected silicon nitride surfaces exposed to etching processes; and (C) functionalized, protected silicon oxide surfaces exposed to etching processes.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. The following detailed description assumes the invention is implemented on a wafer. However, the invention is not so limited. The work piece may be of various shapes, sizes, and materials. In addition to semiconductor wafers, other work pieces that may take advantage of this invention include various articles such as printed circuit boards, magnetic recording media, magnetic recording sensors, mirrors, optical elements, micro-mechanical devices and the like.

Semiconductor fabrication processes may involve selective etching of a silicon-containing material relative to another silicon-containing material. In some cases, fabrication process may involve etching of a silicon-and-oxygen-containing material relative to a silicon-and-nitrogen-containing material and in some applications, high selectivity may be desirable. One example application is in patterning schemes.

Another example application is in fabrication of self-aligned contacts. For advanced logic nodes, small critical dimension contacts are etched into a silicon oxide film with high selectivity to silicon nitride. Small critical dimension contacts may have a critical dimension of less than about 20 nm. For fabrication of a self-aligned contact, lack of protection of the corner of the aligning silicon nitride results in device defects.

During etch, a buried silicon-and-nitrogen-containing material is exposed during etching of silicon-and-oxygen-containing material overlying the silicon-and-nitrogen-containing material and exposure of the silicon-and-nitrogen-containing material during etching of the silicon-and-oxygen-containing material results in degradation and material loss (in some cases, referred to as "nitride loss") of the silicon-and-nitrogen-containing material, which can be detrimental to the device and render the wafer useless. While the term "nitride loss" may be used herein, it will be understood that the "nitride" material may include other elements in addition to silicon and nitrogen, such as hydrogen.

Protection of the corner maintains electrical isolation of gate and source/drain contact. Without protection, initial cycles of etching on the silicon nitride surface when it is first exposed after etching silicon oxide results in silicon nitride loss. Other techniques used to prevent such nitride loss result in excessive polymer blocking the etch, pinching off of the feature, too much deposition of polymer on the silicon oxide etch front, tapering of the feature, or increased depth loading between features.

FIG. 1A shows an example schematic illustration of a substrate 101 whereby nitride loss (denoted as * for 112b/c/d) occurs after etching silicon oxide resulting in exposure of the gate stack 111b beneath the silicon nitride 112b. In comparison, as seen in FIG. 1B, a schematic illustration of a desired substrate 102a after etching silicon oxide 123b/c to the surface of the silicon nitride layer 122b/c/d buried underneath it is depicted. In some cases, when the substrate is etched to remove the silicon oxide in the features between the silicon nitride, nitride loss is observed, resulting in a substrate that may have faceted regions such as shown in substrate 101. In FIG. 1C, a third example three-dimensional substrate 102b is depicted showing the final self-aligned contact 131, spacer 134, cap 132, and gate 133 with a silicon fin 135.

Other applications in logic and patterning techniques may also involve very high selectivity of silicon oxide to silicon nitride etch, where silicon nitride is used as mask layer or as stop layer, or is used in more complex configurations.

Additionally, in high-aspect ratio (HAR) etching, during formation of memory devices, prevention of lateral etching of a silicon nitride layer which is exposed at the sidewall of an etched feature which may be a trench, hole, or more complex shape, may be desired. For example, in the formation of cylindrical holes for DRAM devices, there may be one or more silicon nitride layers included in the etch stack. After etching through one of these silicon nitride layers, silicon oxide may be subsequently etched without substantial lateral etching of the exposed silicon nitride at the sidewall. In another example, in the formation of trenches and cylindrical holes for 3D-NAND devices, a stack of alternating silicon oxide and silicon nitride layers may be etched. After exposing the sidewall of a silicon nitride layer, the etching of the stack may be continued while preventing the lateral etching of the exposed silicon nitride layer. Prevention of lateral etching of exposed silicon oxide layers may also be implemented, but can be easier to achieve than prevention of lateral etching of exposed silicon nitride layers. Such applications of these types of HAR etch processes are referred to here as "HAR sidewall protection," which employs a protected sidewall surface.

For some of these applications, atomic layer etching (ALE) of the oxide material may be a suitable solution but may not be sufficient alone as devices shrink. ALE is a technique that removes thin layers of material using sequential self-limiting reactions. Generally, ALE may be performed using any suitable technique. Examples of atomic layer etch techniques are described in U.S. Pat. No. 8,883,028, issued on Nov. 11, 2014; and U.S. Pat. No. 8,808,561, issued on Aug. 19, 2014, which are herein incorporated by reference for purposes of describing example atomic layer etch and etching techniques. In general, ALE may be performed with plasma, or may be performed thermally.

The concept of an "ALE cycle" is relevant to the discussion of various embodiments herein. Generally an ALE cycle is the minimum set of operations used to perform an etch process one time, such as etching a monolayer. In some cases, ALE etches more than a monolayer. The result of one cycle is that at least some of a film layer on a substrate surface is etched. Typically, an ALE cycle includes a modification or deposition operation to form a modified or reactive layer, followed by a removal or activation operation to remove or etch only this modified or reactive layer.

While the term "modification" may be used to describe an operation used to form a reactive layer, in some embodiments, such operation may involve deposition. The term "deposition" is used herein to mean causing deposition of a surface layer which includes chemistry with the potential to etch the substrate. While the term "removal" may be used to describe an operation used to remove a reactive layer formed during modification or deposition, in some embodiments, such operation may be referred to as "activation." "Activation" is used herein to mean causing a deposited surface layer to react with the substrate, creating volatile etch products which are removed from the substrate surface. In some embodiments, the activation is achieved using a plasma to produce ion bombardment of the surface. The net effect of the activation operation is to remove both the deposited surface layer and an incremental depth of the substrate.

An ALE cycle may include certain ancillary operations such as purging one of the reactants or byproducts. Generally, a cycle contains one instance of a unique sequence of operations. As an example, an ALE cycle may include the following operations: (i) delivery of a reactant gas, (ii) purging of the reactant gas from the chamber, (iii) delivery of a removal gas and an optional plasma, and (iv) purging of the chamber. In some embodiments, etching may be performed nonconformally.

Reduction of nitride loss in ALE of silicon-and-oxygen-containing material may be mitigated by using a lower activation ion energy, lower activation ion flux, less activation time, more polymer deposition, higher C:F ratio in polymer, and less use of carbon-removing gases. However, these methods also negatively affect the etching of the silicon-and-oxygen-containing material, such as excessive polymer buildup at a silicon-and-oxygen-containing surface causing slower etch, random etch stop, worse sidewall tapering, and/or greater etch depth loading between features with different geometry. Another negative effect may be excessive deposition on a mask, leading to pinchoff of features and blocked etch. Collectively these negative effects can be described as "trade-offs."

Provided herein are methods and apparatuses for selectively etching silicon-and-oxygen-containing material relative to silicon-and-nitrogen-containing material by modifying the silicon-and-nitrogen-containing material with a sacrificial self-assembled monolayer (SAM) without substantially affecting the surface of the silicon-and-oxygen-containing material. Use of SAM precursors to selectively block one silicon-containing material versus another silicon-containing material allows for passivation of the blocked silicon-containing material to allow etching of the other, non-blocked silicon-containing material. Because the SAM has a self-limiting surface thickness, and the SAM is targeted to the silicon-and-nitrogen-containing material, certain disclosed embodiments are less likely to induce negative trade-offs as described above.

Additionally, provided herein are methods and apparatuses for HAR sidewall protection of exposed silicon-and-nitrogen-containing material by modifying the silicon-and-nitrogen-containing material with a sacrificial SAM to provide a protected silicon-and-nitrogen-containing surface. Modification of the silicon-and-oxide-containing material may be optional in some embodiments because the lateral loss of that material is typically less than of the silicon-and-nitrogen-containing material.

Certain disclosed embodiments involve a method to increase etch selectivity while avoiding some of the typical trade-offs of other etching techniques. Certain disclosed embodiments increase selectivity of silicon-and-oxygen-containing material relative to silicon-and-nitrogen-containing material. In certain embodiments described herein, "silicon-and-oxygen-containing material" can be silicon oxide, such as silicon dioxide ($SiO_2$) or other materials that include silicon and oxygen atoms, with no appreciable amounts of nitrogen atoms. As used herein, "silicon-and-oxygen-containing material" refers to material that does not include enough nitrogen to significantly influence the etching properties. In certain embodiments described herein, "silicon-and-nitrogen-containing material" may refer to silicon nitride, which may be characterized as $SiN_x$ where x represents the ratio of N to Si atoms, which may vary depending on the method of film deposition, and "silicon-and-nitrogen-containing material" may also refer to other materials that include silicon and nitrogen atoms.

Selectivity described herein depends on the duration of surface exposure to the SAM precursor and the SAM precursor chemistry. In various embodiments, silicon-and-nitrogen-containing surfaces exposed to a SAM precursor prior to etching a silicon-and-oxygen-containing surface exhibits reduced net loss of its thickness relative to a silicon-and-nitrogen-containing surface not exposed to a SAM precursor. For example, in some cases, nitride loss reduction may be at least about 2 nm for particular etching processes, such as processes for etching between about 50 nm and about 150 nm of silicon oxide.

Certain disclosed embodiments may be used to fabricate self-aligned contacts and for other etch applications in logic and patterning. In various embodiments, the method uses a non-plasma treatment with a carbon-containing SAM precursor to selectively protect a silicon-and-nitrogen-containing surface, relative to a silicon-and-oxygen-containing surface. The SAM precursor molecules selectively attach to the silicon-and-nitrogen-containing surface which reduces removal of silicon-and-nitrogen-containing material in subsequent etch steps. In particular, this method believed to be especially effective in reducing the initial damage and loss of silicon-and-nitrogen-containing material etching when exposed to etch chemistries used to etch silicon-and-oxygen-containing surfaces, before other plasma etching mechanisms can build up passivation on silicon-and-nitrogen-containing surface. This approach can be combined with ALE of silicon-and-oxygen-containing material.

While certain examples described herein involve selectively adsorbing SAM precursors to silicon-and-nitrogen-containing surfaces to selectively etch silicon-and-oxygen-containing surfaces, it will be understood that certain embodiments may also be used to selectively adsorb a SAM precursor to silicon-and-oxygen-containing surfaces to selectively etch silicon-and-nitrogen-containing surfaces. Etching for all embodiments may involve ALE, and ALE may involve exposing the substrate to a plasma. It will be understood that while ALE is described herein as a method of etching after a substrate is exposed to a SAM precursor, other etching techniques including but not limited to continuous etching may be used in lieu of or in combination with ALE.

Figure 2B:
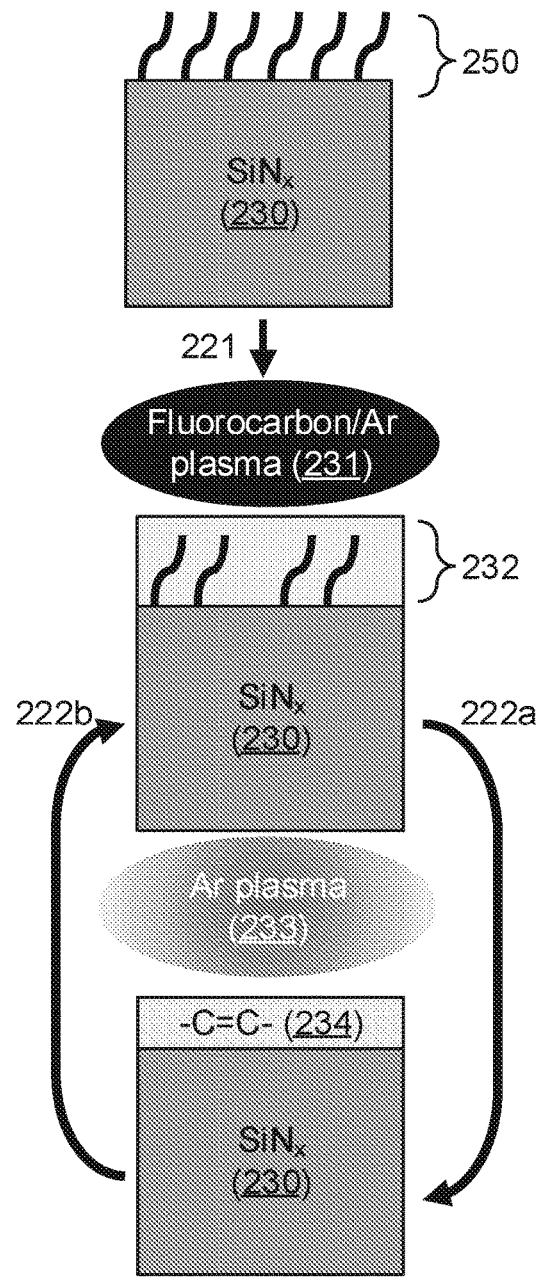

FIG. 2A-2B shows a schematic illustration of substrates without and with functionalized ALE. The term "functionalized" used herein refers to substrates whereby a SAM precursor has been attached to the substrate. Such a functionalized surface can provide a protected surface, as described herein. In FIG. 2A, an example is provided whereby a substrate 210 is exposed (in operation 201) to a fluorocarbon plasma with argon 211, which thereby causes formation of $CF_x$ 212 on the surface of a silicon nitride material 210, and subsequent activation (in operation 202a) using argon plasma 213 results in formation of graphitic carbon 214 on the surface of the silicon nitride 210a, as well as silicon nitride loss (the difference in thickness between the upper 210 and lower 210a silicon nitride films in FIG. 2A shows nitride loss after etching). In FIG. 2B, an example is provided whereby a substrate 230 having SAM precursors 250 on the surface after a non-plasma thermal modification process of a silicon nitride film is exposed (in operation 221) to the same fluorocarbon plasma with argon 231 to form $CF_x$ 232, and subsequent exposure (in operation 222a) to the argon activation plasma 233 results in additional formation of graphitic carbon 234 on the surface of the silicon nitride 230 with little to negligible nitride loss (the thickness of the silicon nitride is the same before and after argon plasma exposure). In these methods, activation using argon plasma and fluorocarbon plasma with argon can be repeated (as in operations 202a/b in FIG. 2A and operations 222a/b in FIG. 2B). Such example shows functionalized ALE in accordance with certain disclosed embodiments, and without being bound by theory, as a substrate is exposed to a non-plasma thermal modification process to form a SAM on the silicon nitride surface and the substrate is exposed to an etch chemistry used to etch a silicon oxide material such that a graphitic carbon layer forms atop the silicon nitride layer, thereby providing a protected silicon nitride surface and reducing the etch removal of silicon nitride.

Figure 2C:
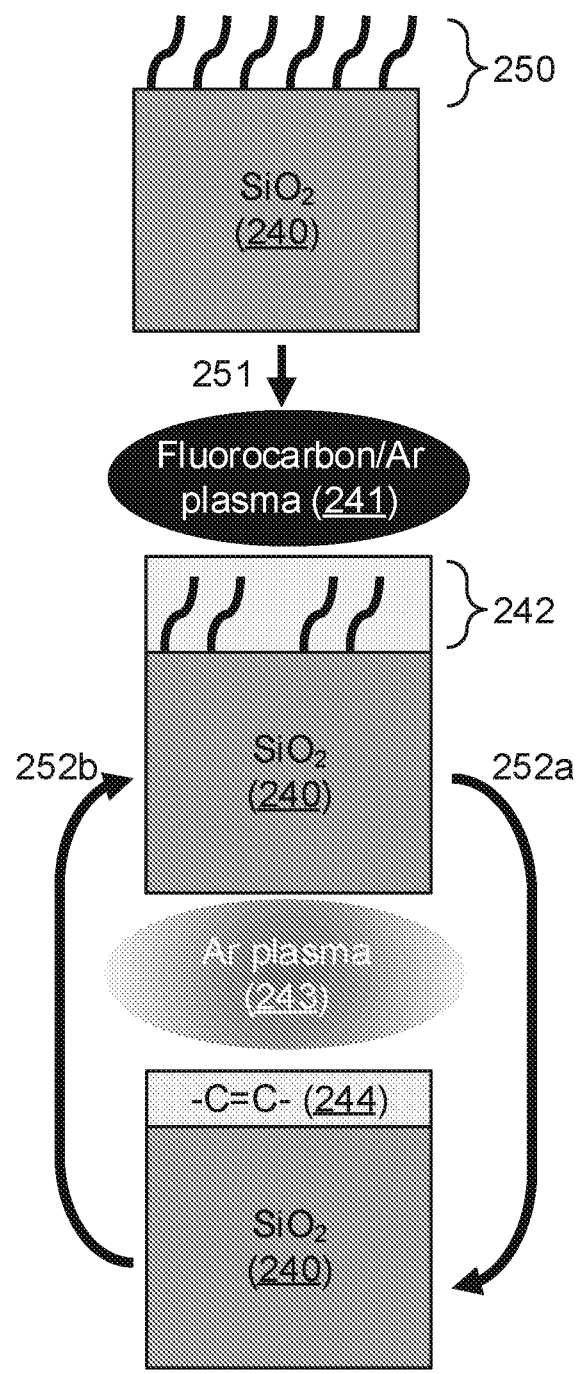

In FIG. 2C, an example is provided whereby a substrate 240 having SAM precursors 250 on the surface after a non-plasma thermal modification process of a silicon oxide film is exposed (in operation 251) to a fluorocarbon plasma with argon 241 to form $CF_x$ 242, and subsequent exposure (in operation 252a) to the argon activation plasma 243 results in additional formation of graphitic carbon 244 on the surface of the silicon oxide 240 with little to negligible oxide loss (the thickness of the silicon oxide is the same before and after argon plasma exposure). In these methods, activation using argon plasma and fluorocarbon plasma with argon can be repeated (as in operation 252a/b in FIG. 2C). Such example shows functionalized ALE in accordance with certain disclosed embodiments, and without being bound by theory, as a substrate is exposed to a non-plasma thermal modification process to form a SAM on the silicon oxide surface and the substrate is exposed to an etch chemistry used to etch a silicon nitride material such that a graphitic carbon layer forms atop the silicon oxide layer, thereby providing a protected silicon oxide surface and reducing the etch removal of silicon oxide.

Figure 3A:
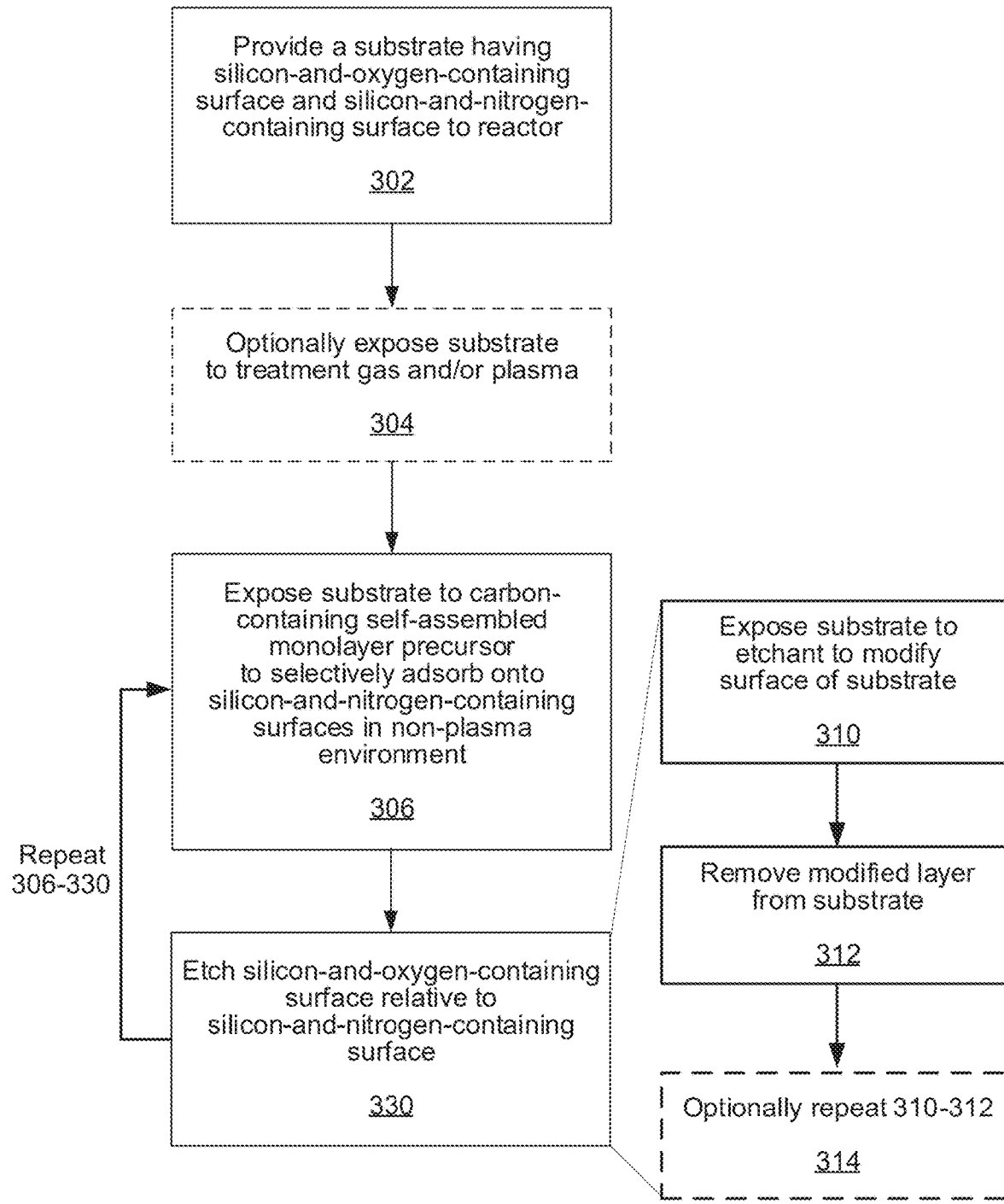
FIG. 3A is a process flow diagram of operations performed in accordance with certain disclosed embodiments.

FIG. 3A shows an example process flow diagram of operations that may be performed in accordance with certain disclosed embodiments.

In operation 302, a substrate having a silicon-and-oxygen-containing surface and a silicon-and-nitrogen-containing surface is provided to a process chamber. The chamber may be a chamber in a multi-chamber apparatus or a single-chamber apparatus. The substrate may be a silicon wafer, e.g., a 200-mm wafer, a 300-mm wafer, or a 450-mm wafer, including wafers having one or more layers of material, such as dielectric, conducting, or semi-conducting material deposited thereon. In some embodiments, the substrate includes a layer of silicon oxide over buried silicon nitride regions. In some embodiments, the substrate includes exposed silicon oxide and silicon nitride surfaces.

In some embodiments, the layers on the substrate may be patterned. Substrates may have "features" such as via or contact holes, which may be characterized by one or more of narrow and/or re-entrant openings, constrictions within the feature, and high aspect ratios. The feature may be formed in one or more of the above described layers. One example of a feature is a hole or via in a semiconductor substrate or a layer on the substrate. Another example is a trench in a substrate or layer. In various embodiments, the feature may have an under-layer, such as a barrier layer or adhesion layer. Non-limiting examples of under-layers include dielectric layers and conducting layers, e.g., silicon oxides, silicon nitrides, silicon carbides, metal oxides, metal nitrides, metal carbides, and metal layers.

In some embodiments, the substrate is a partially fabricated semiconductor wafer having a silicon-and-oxygen-containing material partially etched by ALE whereby ALE was stopped after exposing underlying silicon-and-nitrogen-containing material. That is, in some embodiments, a substrate having silicon-and-oxygen-containing material and a buried silicon-and-nitrogen-containing material may be exposed to cycles of ALE without having been exposed the substrate to a SAM precursor, and cycles of ALE are stopped when the silicon-and-nitrogen-containing surface underlying the silicon-and-oxygen-containing material is exposed, such that operations described below with respect to operations 304-330 are subsequently performed.

In some embodiments, the silicon-and-nitrogen-containing material and silicon-and-oxygen-containing material are on a planar surface. In some embodiments, the surface is three-dimensional and includes multiple surfaces and varying topography and the silicon-and-nitrogen-containing material and silicon-and-oxygen-containing material are on multiple surfaces.

Examples of silicon-and-nitrogen-containing materials include but are not limited to silicon nitride (SiN), silicon carbonitride (SiCN), silicon oxynitride (SiON), hydrogen-terminated silicon nitride (SiN:H), primary-amine-terminated silicon nitride, secondary-amine-terminated silicon nitride, doped versions of these materials and combinations thereof.

Particular example materials include stoichiometric and non-stoichiometric formulations of SiN, SiON, SiCN, SiN:H, etc.

Examples of silicon-and-oxygen-containing materials include but are not limited to silicon dioxide ($SiO_2$), silicon oxycarbide, carbon-doped silicon oxide (e.g., SiCOH, including those generated from linear or cyclic silanes), low-k dielectrics, porous oxides, non-porous oxides, doped versions of these materials, and combinations thereof. Particular example materials include stoichiometric and non-stoichiometric formulations of $SiO_2$, SiCOH, etc. In some embodiments, the silicon-and-oxygen-containing material is doped. In some embodiments, the silicon-and-oxygen-containing material is porous. In some embodiments, the silicon-and-oxygen-containing material is non-porous. In some embodiments, the silicon-and-oxygen-containing material is a low-k dielectric.

In some embodiments for self-aligned contact applications, the substrate includes silicon-and-oxygen-containing material filled in a feature between silicon-and-nitrogen-containing pillars having a depth of about 30 nm to about 100 nm with features between silicon-and-nitrogen-containing pillars having an aspect ratio of at least about 2:1 or at least about 5:1 or at least about 10:1 or at least about 20:1.

In other embodiments for HAR sidewall protection, the substrate includes one or more layers of a silicon-and-oxygen-containing material and one or more layers of a silicon-and-nitrogen-containing material, and is etched with a hole or trench feature to an aspect ratio of at least about 20:1, or at least about 50:1, or at least about 100:1 or greater. A surface provided by the silicon-and-nitrogen-containing material can be a sidewall, and a SAM precursor can be employed to functionalize the surface to provide a protected sidewall surface.

In operation 304, the substrate is optionally exposed to a process to pre-treat the surface of the substrate. The process may be a thermal process of a plasma-based process. The process may include exposure to a treatment gas. Example gases include hydrogen, argon, nitrogen, helium, and combinations thereof.

Pre-treatment may be performed by exposing to a plasma of a suitable gas. Pre-treatment may be performed using a plasma. A plasma may be ignited in situ or in a remote plasma chamber in a hydrogen environment to generate hydrogen-containing reactive species that are delivered to the substrate surface. In some embodiments, radio frequency (RF) bias may be applied at a power between 5 W and about 150 W. In some embodiments, no bias is applied.

In some embodiments, pre-treatment is performed to increase the presence of hydrogen on the surface of the silicon-and-nitrogen-containing material. In some embodiments, pre-treatment is performed to remove oxidized surfaces of a silicon-and-nitrogen-containing material. Pre-treatment is optional. In some cases, pre-treatment is performed in the same chamber as exposure to the SAM precursor and/or exposure to the etching chemistries. In some cases, pre-treatment is performed in a chamber separate from the chamber for either exposure to the SAM precursor and/or exposure to the etching chemistries.

In operation 306, the substrate is exposed to a carbon-containing SAM precursor to selectively adsorb the carbon-containing SAM precursor to the silicon-and-nitrogen-containing surfaces relative to the silicon-and-oxygen-containing surfaces in a non-plasma environment. The carbon-containing SAM precursor selectively adsorbs onto silicon-and-nitrogen-containing surfaces relative to silicon-and-oxygen-containing surfaces on the substrate. The carbon-containing SAM precursor is selected such that adsorption on the silicon-and-oxygen-containing surfaces is limited or negligible. Operation 306 is performed thermally. No plasma is used during this operation. Without being bound by a particular theory, it is believed that the use of plasma during this operation would reduce the selectivity of the adsorption onto the silicon-and-nitrogen-containing material vs. the silicon-and-oxygen-containing material.

Suitable SAM precursors may be carbon-rich. SAM precursors include a head and a tail component. In disclosed embodiments, the head is reactive with the silicon-and-nitrogen-containing material on the substrate surface and forms a chemical bond with the silicon-and-nitrogen-containing material. In various embodiments, the head reacts with a —NH, —$NH_2$, or —$NH_x$ terminated surface.

The tail component is an organic group having one or more carbon atoms such that the tail provides protection against etch chemistries for etching silicon-and-oxygen-containing materials, such as a fluorocarbon etch chemistry and/or an activation gas or plasma used during etch. Without being bound by theory, this protected surface may be achieved by the formation of a carbon-rich layer, which attenuates the transport of atoms and ions to the substrate surface in subsequent processing.

SAM precursors react with the silicon-and-nitrogen-containing surface in a self-limiting manner. The result is a monolayer of SAM film that can be used to provide a protected silicon-and-nitrogen-containing surface that is protected from etching during a subsequent etch step. The self-limiting nature of the film avoids possible problems due to excessive deposition. Excessive deposition can result in pinchoff of features, reduced critical dimension, and/or modification of the feature profile. With SAM films, there is not necessarily a need to cyclically expose the substrate to different precursors. However, in some cases, SAM precursors may be delivered in stages, with an optional purge (e.g., with a purge gas and/or pumpdown) occurring between the stages of precursor delivery.

In certain embodiments, the SAM precursor used to form the protected surface or protective film may be flowed into the vacuum chamber until the precursor reaches about 100% saturation on a silicon-and-nitrogen-containing surface such that a layer of the protective film deposited has a maximum surface coverage. Under- and over-saturation may also be practiced in some embodiments, for example to control selective deposition on different surfaces, to tailor the deposited film coverage, or to reduce the processing time.

One way to ensure that the protected surface or protective layer forms selectively or preferentially on certain layers compared to other layers is to select a SAM precursor that will preferentially react with surface groups present on one type of layer compared to others. The head group of the SAM precursor plays a role in this relative reactivity. For instance, ketone- and aldehyde-based head groups may preferentially react with amines compared to hydroxyls.

Example SAM precursors that may be used in certain disclosed embodiments for attaching SAM precursors onto silicon-and-nitrogen-containing surfaces include aldehydes and isothiocyanates.

Example aldehydes include benzaldehyde, 1-hexanal, and trimethylhexanal. In some embodiments, benzaldehyde with one or more fluorine atoms substituted for hydrogen atoms may be used. A fluorine-substituted benzaldehyde may be used in some embodiments as excessive hydrogen content in a SAM precursor may cause nitride etch.

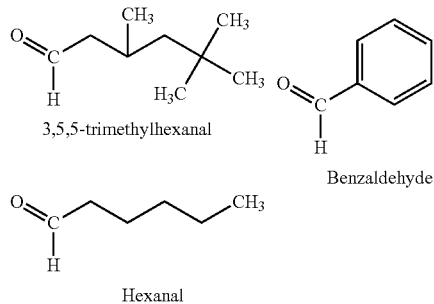

3,5,5-trimethylhexanal

Benzaldehyde

Hexanal

Example isothiocyanates include phenyl isothiocyanate and hexyl isothiocyanate.

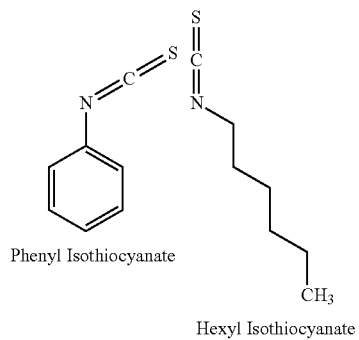

Phenyl Isothiocyanate

Hexyl Isothiocyanate

Other non-limiting SAM precursors include:

$R^1$—C(O)—$R^2$ or $R^1$—NCS, in which $R^1$ includes an organic moiety, and in which $R^2$ is hydrogen (H) or an organic moiety. The organic moieties for $R^1$ and $R^2$ can be the same of different. In some embodiments, each of $R^1$ and/or $R^2$ can be or include, independently, optionally substituted aliphatic, optionally substituted heteroaliphatic, optionally substituted cycloaliphatic, optionally substituted cycloheteroaliphatic, or optionally substituted aromatic. In other embodiments, each of $R^1$ and/or $R^2$ can be or include, independently, optionally substituted alkyl, optionally substituted alkenyl, optionally substituted alkynyl, optionally substituted heteroalkyl, optionally substituted heteroalkenyl, optionally substituted heteroalkynyl, optionally substituted cycloalkyl, optionally substituted cycloheteroalkyl, optionally substituted aryl, or optionally substituted heterocyclyl. Examples of substitutions for $R^1$ and $R^2$ can include any described herein for alkyl or aryl.

In particular embodiments, each of $R^1$ and/or $R^2$ is, independently, a branched-chain hydrocarbon or a linear hydrocarbon. In some embodiments, each of $R^1$ and/or $R^2$ is, independently, an optionally substituted phenyl. In other embodiments, each of $R^1$ and $R^2$ is, independently, includes one or more halo substitutions (e.g., one or more fluorine substitutions) or haloalkyl substitutions. In any embodiment herein, $R^2$ is H.

Returning to FIG. 3A, operation 306 is performed using particular process conditions, such as specific wafer temperature, chamber pressure, and exposure times. Process conditions described herein refer to process conditions for selectively attaching SAM precursors to a silicon-and-nitrogen-containing surface relative to a silicon-and-oxygen-containing surface. The wafer temperature may affect the properties and behavior of the SAM precursor. The wafer temperature is selected so as to prevent condensation of the SAM precursor, to prevent thermal decomposition of the SAM precursors or SAM, and to avoid other unwanted behaviors. Wafer temperature described herein refers to the temperature that a pedestal holding the wafer may be set at. The wafer temperature during operation 306 may be between about −40° C. and about 550° C.; or between about 20° C.; and about 150° C.; or between about 80° C. and about 120° C.

The dose (which is determined by pressure multiplied by exposure time) may affect the SAM precursor adsorption rate and extent of adsorption. The units for dose may be in megaLangmuirs ("ML") (1 Torr-second). The dose may depend on chemical reactivity, which can vary widely, depending on the chemicals used and the temperature. In various embodiments, the dose may be between about 0.1 ML to about 500 ML, or between about 0.5 ML and about 200 ML, or between about 1 ML and about 300 ML, or between about 5 ML and about 100 ML, or between about 10 ML and about 200 ML, or between about 30 ML and about 150 ML. Ranges provided herein may include their end points.

In operation 330, the silicon-and-oxygen-containing surface is etched selective to silicon-and-nitrogen-containing surface having the SAM precursors adsorbed thereon. Although ALE is described herein as an example, it will be understood that other etching processes, including continuous plasma etching, may be used instead or in combination with ALE.

Figure 3B:
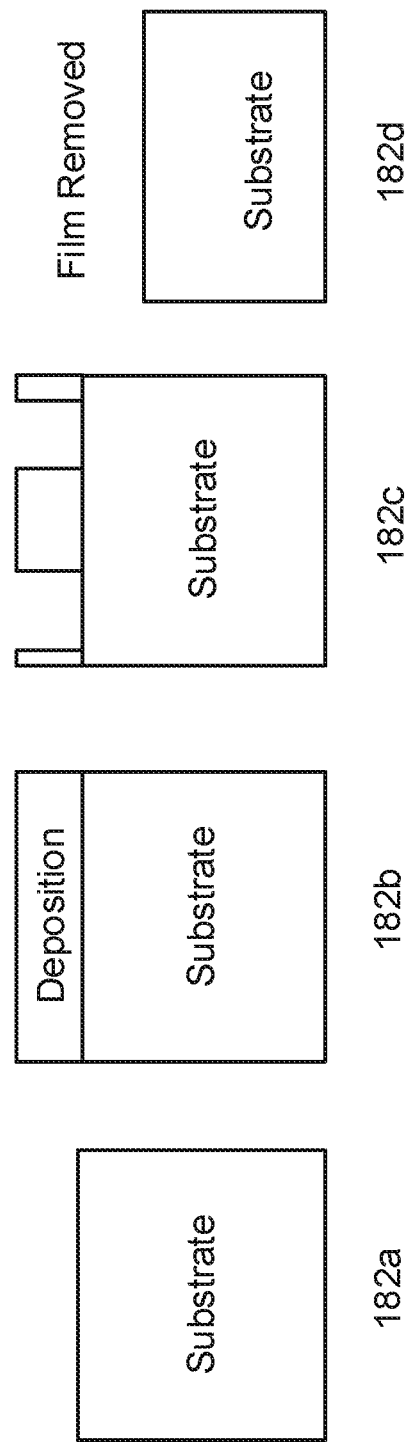
FIG. 3B is a schematic illustration of substrates in an etch process.

In various embodiments, etching is performed by ALE. ALE may be performed in cycles. FIG. 3B shows two example schematic illustrations of an ALE cycle.

In 182a, a silicon oxide substrate is provided, which includes many silicon and oxygen atoms. In 182b, a fluorine source, such as hexafluoro-1,3-butadiene ($C_4F_6$), is introduced to the substrate such that reactive radical species generated from fluorocarbon ($C_xF_y$ or $C_xH_zF_y$) plasma are deposited onto the substrate, thereby forming a reactive layer. The schematic shown in 182b shows that some reacted fluorocarbon radical species is deposited onto the surface of the substrate. Other generic fluorine source such as carbon fluoride or sources having chemical formulas of one or more of the following: $C_xF_y$, $CF_x$, $CHF_x$, or $C_xH_zF_y$ can be used and $C_4F_6$ (hexafluoro-1,3-butadiene) is provided as an example. Other example fluorocarbons include $CF_4$, $C_2F_6$, $C_3F_8$, $C_3F_6$ (including hexafluoropropene and isomers thereof), $C_4F_6$ (including hexafluoro-2-butyne and isomers thereof), $C_4F_8$ (including octafluoro-2-butene, octafluorocyclobutane (cyclo-$C_4F_8$), and isomers thereof), $CHF_3$, $C_2HF_5$ (including pentafluoroethane and isomers thereof), $CH_2F_2$, $C_2H_2F_4$, $C_3HF_5$ (including 1,1,3,3,3-pentafluoro-1-propene, (E)-1,2,3,3,3-pentafluoropropene, and isomers thereof), $C_3H_3F_3$ (including 3,3,3-trifluoropropene and isomers thereof), $C_5F_8$ (including octafluorocyclopentene and isomers thereof), or $C_6F_{10}$ (including decafluorocyclohexene and isomers thereof), in which such fluorocarbons can optionally include one or more conjugated bonds (e.g., —C═C— bonds). Yet other examples of fluorocarbons include a perfluorocarbon or a hydrofluorocarbon, such as $C_xF_y$ or $C_xH_zF_y$, in which x is from 1 to 6, y is 1 or more (e.g., from 1 to 14), and z is 0, 1, or more (e.g., from 0 to 13 or from 1 to 13). During deposition, polymeric $CF_x$ may be deposited as a film onto the surface of the substrate. The fluorine source is optionally purged from the chamber. In 182c, an activation gas is introduced to remove the reactive layer from the surface of the substrate and an incremental amount of the substrate. During such operation, without wishing to be bound by theory, ion bombardment creates fluorine and carbon radicals, which can etch silicon. Ions can also break Si—O bonds in the silicon oxide film, thereby promoting reactions with fluorine and carbon radicals. In 182e, the chamber is purged, and the byproducts are removed but such operation may be optional. 182e shows the reactive layer and an incremental amount of the substrate is removed.

A cycle may only partially etch about 0.1 nm to about 20 nm of material, or between about 0.1 nm and about 5 nm of material, or between about 0.2 nm and about 5 nm of material, or between about 0.5 nm and about 3 nm of material. In some embodiments, a cycle of ALE may remove less than a monolayer of material.

Operation 330 in FIG. 3A shows three example operations that may be performed to etch the silicon-and-oxygen-containing surface relative to the silicon-and-nitrogen-containing surface using ALE.

Operation 310 involves exposing the substrate to plasma reactive species that thereby deposit onto the surface of the substrate. Plasma reactive species are deposited onto the silicon-and-oxygen-containing surface. The SAM precursors on silicon-and-nitrogen-containing surfaces prevent activation by acting as a barrier to prevent ions and etch radicals from reaching SiNx as further described below.

In some embodiments, deposition of plasma reactive species onto a silicon-and-oxygen-containing material may not be self-limiting. In some embodiments, deposition of plasma reactive species onto a silicon-and-oxygen-containing material is self-limiting.

Plasma reactive species include radicals and may be generated from a fluorocarbon plasma. In some embodiments, plasma reactive species are generated from a hydrofluorocarbon-containing plasma, a halogen-containing plasma, a carbon-containing plasma, a halogen-and-carbon-containing plasma, or combinations thereof. Example plasmas that may generate plasma reactive species to deposit onto the surface of the substrate during operation 310 include $C_4F_6$, $C_4F_8$, a perfluorocarbon, or a fluorohydrocarbon, as described herein.

As described herein, in operations where particular gases are introduced into the chamber, in some embodiments involving atomic layer etch using a plasma, the reactor or chamber may be stabilized by introducing the chemistry into the chamber prior to processing the substrate or wafer. Stabilizing the chamber may use the same flow rates, pressure, temperatures, and other conditions as the chemistry to be used in the operation following the stabilization. In some embodiments, stabilizing the chamber may involve different parameters. In some embodiments, a carrier gas, such as nitrogen, argon, neon, helium, and combinations thereof, is continuously flowed during ALE. In some embodiments, a carrier gas is only used during activation. The carrier gas may be used as a purge gas in some operations as described below. In some embodiments, another activation gas is used to remove residue from the reactive layer formed from the deposition operation. In some embodiments, a carrier gas is not flowed during activation.

The deposition operation forms a thin, reactive surface layer with a thickness that can be activated and removed more easily than the bare material in the subsequent activation operation. In a deposition operation, plasma reactive species from a fluorocarbon plasma are deposited onto a substrate with silicon-and-oxygen-containing surfaces. A fluorocarbon is used as an example depositing species in some embodiments, but it will be understood that in some embodiments, a different depositing gas is used. The plasma used may be selected depending on the type and chemistry of the substrate to be etched. In some embodiments, a plasma may be ignited, and fluorocarbon and/or plasma reactive species generated from fluorocarbon plasma reacts with the substrate to deposit fluorine and carbon onto the surface. In various embodiments, a fluorocarbon is introduced into the chamber in a gaseous form and may be optionally accompanied by a carrier gas which may be any of those described above. The reactive species generated from a fluorocarbon plasma can be generated directly by forming a plasma in the process chamber housing the substrate or they can be generated remotely in a process chamber that does not house the substrate, and can be supplied into the process chamber housing the substrate.

In various embodiments, the plasma may be an inductively coupled plasma or a capacitively coupled plasma. A capacitively coupled plasma may be operated at a power between about 5 W and about 200 W. In some embodiments, the power may be provided at an RF frequency between about 13 MHz and 100 MHz. In some embodiments, a purge may be optionally performed after operation 310. In a purge operation, non-surface-bound plasma reactive species generated from fluorocarbon (such as fluorine and carbon radicals) may be removed from the process chamber. This can be done by purging and/or evacuating the process chamber to remove the active species, without removing the deposited layer. The species generated in a fluorocarbon plasma can be removed by simply stopping the plasma and allowing the remaining species decay, optionally combined with purging and/or evacuation of the chamber. Purging can be done using any inert gas such as nitrogen ($N_2$), argon (Ar), neon (Ne), helium (He), and their combinations. In various embodiments, purging is not performed after operation 310, and is not performed after operation 312 in repeated cycles of operations 310 and 312.

In operation 312, the substrate may be exposed to an energy source (e.g. activating or sputtering gas or chemically reactive species that induces removal), such as argon plasma, or helium plasma, or nitrogen plasma, to remove the material from the surface of the substrate. In some embodiments, removal removes both the deposited $CF_x$ material and an increment of the underlying silicon-and-oxygen-containing material. Removal may involve etching the substrate by directional sputtering. In some embodiments, the removal operation may be performed by ion bombardment. During removal, a bias may be optionally turned on to facilitate directional sputtering. In some embodiments, ALE may be isotropic.

In various embodiments, the pressure of the chamber may vary between the deposition and activation operations. The targeted pressure of the gas may depend on the size of the chamber, the conductance of the chamber pumping, the flow rate of the gas, the temperature of the reactor, the type of substrate, and the size of substrate to be etched. In various embodiments, an additional lower-frequency RF source may be applied during the removal step to increase the bias. This additional source may have a frequency in the range of about 400 kHz to about 13 MHz. In some embodiments, the chamber may be purged after a removal operation. Purge processes may be any of those used for a purge after a modification operation.

In operation 314, operations 310 and 312 may be optionally repeated in cycles. In some embodiments, operation 310 and 312 are repeated in temporally separated alternating pulses. In some embodiments, operations 310 and 312 are repeated continuously in cycles without purging or turning off RF plasma between performing the operations.

In various embodiments, the modification and removal operations may be repeated in cycles, such as about 1 to about 6 cycles, or about 1 to about 15 cycles, or about 1 to about 50 cycles, or more than 100 cycles. Any suitable number of ALE cycles may be included to etch a desired amount of film. In some embodiments, ALE is performed in cycles to etch about 30 nm to about 100 nm of silicon-and-oxygen-containing material on the substrate.

Each of operations 306 and 330 may be performed in separate chambers, in the same chamber, or in different chambers of the same tool. In various embodiments, operations 306 and 330 are performed without breaking vacuum.

During an ALE etching process in operation 330, carbon may accumulate on the surface of the silicon-and-nitrogen-containing surface. While ALE may almost fully remove $CF_x$ buildup on the silicon-and-oxygen-containing surface during activation, residual carbon accumulation on the silicon-and-nitrogen-containing surface may occur. Such buildup may also further contribute to the selectivity of the etching process such that the carbon buildup slows down any potential etching on the silicon-and-nitrogen-containing surface, thereby increasing the selectivity.

Operations 306 and 330 may be repeated in certain embodiments. Where ALE is used in operation 330, the number of cycles of ALE that may be performed before repeating operation 306 may vary over time and depends on substrate topography, thicknesses of materials on the substrate, process conditions used, and other parameters.

In various embodiments, operations 306 and 330 are repeated to replenish SAM precursors on silicon-and-nitrogen-containing surfaces. For example, in some cases, graphitic carbon may be formed on the silicon-and-nitrogen-containing surfaces when SAM precursors are subsequently exposed to etching chemistries in operation 330, but in some cases, such graphitic carbon may also be etched such that the silicon-and-nitrogen-containing surface is thereby exposed. SAM precursor exposure in operation 306 may be repeated to replenish SAM precursors such that new SAM precursors can attach to the exposed silicon-and-nitrogen-containing surface prior to continuing to etch silicon-and-oxygen-containing material in operation 330.

In various embodiments, operations 306 and 330 are repeated to address uniformity and loading issues. For example, the substrate provided in operation 302 may not necessarily have all of the silicon-and-nitrogen-containing surfaces exposed, such that after multiple cycles of etching in operation 330, additional silicon-and-nitrogen-containing surfaces may be exposed that do not have adsorbed SAM precursors attached. This may occur due to non-uniformity of the films or partially etched films across the substrate and/or variations between different within-die features.

Thus, operation 306 may be further repeated to adsorb SAM precursors onto the newly exposed silicon-and-nitrogen-containing surfaces to ensure selective etching of the silicon-and-oxygen-containing material.

There may be etch applications which involve selective etching of silicon nitride with minimal etching of silicon oxide. In some embodiments, SAM precursors may be used to selectively adsorb onto silicon-and-oxygen-containing surfaces relative to silicon-and-nitrogen-containing surfaces to thereby etch silicon-and-nitrogen-containing surfaces selectively. In such cases, SAM precursors may be selected such that the head group on the SAM precursor is more reactive with —OH terminated silicon-and-oxygen-containing surfaces and not or less reactive with —NH, —$NH_2$, or —$NH_x$ terminated silicon-and-nitrogen-containing surfaces.

Further description and examples of such processes are described in detail in "Surface prefunctionalization of $SiO_2$ to modify the etch per cycle during plasma-assisted atomic layer etching" by Gasvoda et al., J. Vac. Sci. Technol. A 37(5), published on Aug. 28, 2019, which is herein incorporated by reference in its entirety.

Figure 3C:
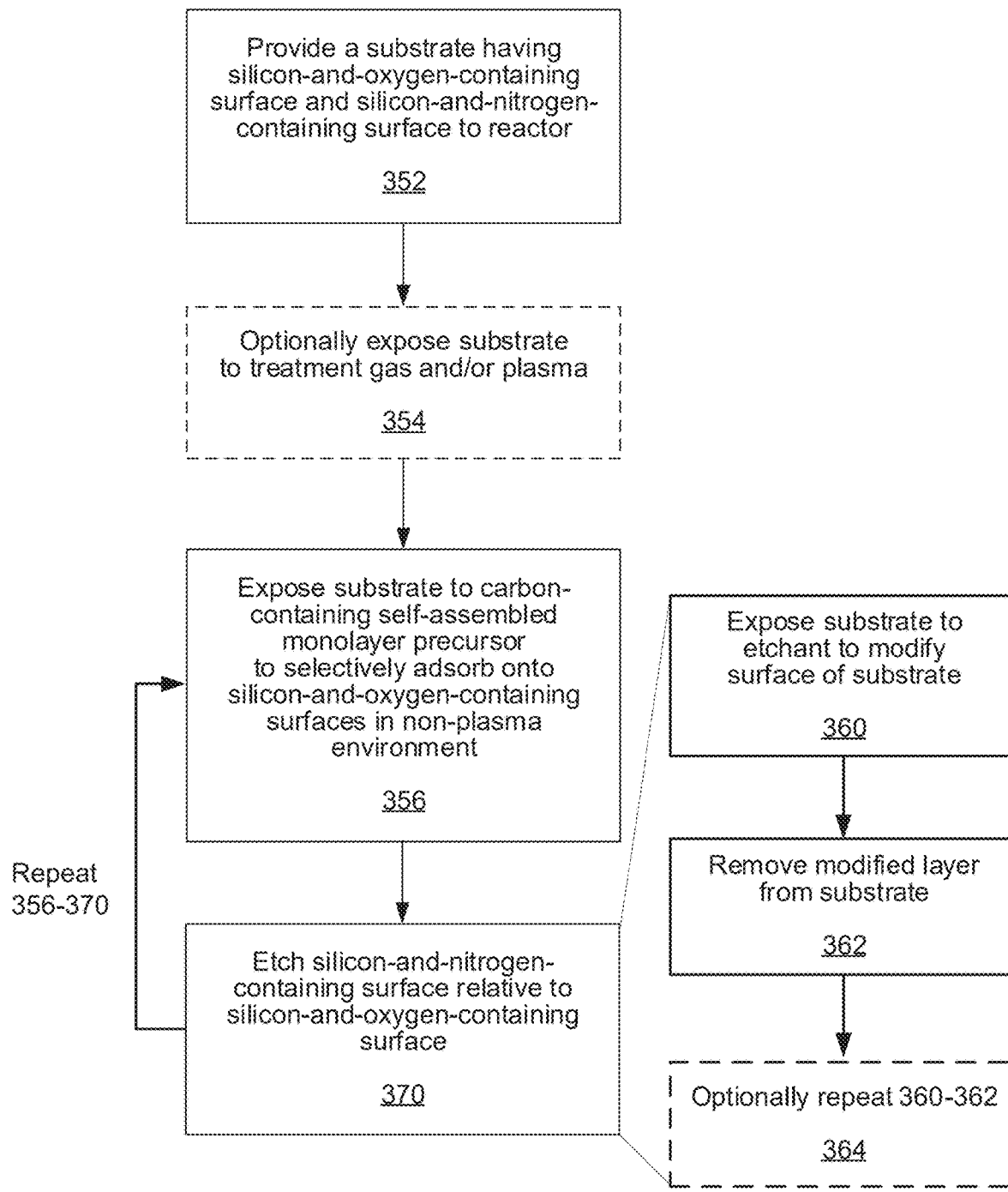
FIG. 3C is another process flow diagram of operations performed in accordance with certain disclosed embodiments.

FIG. 3C shows an example process flow diagram of operations that may be performed in accordance with certain disclosed embodiments. In operation 352, a substrate shows an example process flow diagram of operations that may be performed in accordance with certain disclosed embodiments. Embodiments of substrates, chambers, and apparatuses are described herein. In optional operation 354, the substrate is optionally exposed to a process to pre-treat the surface of the substrate, and pre-treatment conditions are described herein.

In operation 356, the substrate is exposed to a carbon-containing SAM precursor to selectively adsorb the carbon-containing SAM precursor to the silicon-and-oxygen-containing surfaces relative to the silicon-and-nitrogen-containing surfaces in a non-plasma environment. The carbon-containing SAM precursor selectively adsorbs onto silicon-and-oxygen-containing surfaces relative to silicon-and-nitrogen-containing surfaces on the substrate. The carbon-containing SAM precursor is selected such that adsorption on the silicon-and-nitrogen-containing surfaces is limited or negligible. Operation 356 can be performed thermally. No plasma is used during this operation. Without being bound by a particular theory, it is believed that the use of plasma during this operation would reduce the selectivity of the adsorption onto the silicon-and-nitrogen-containing material vs. the silicon-and-oxygen-containing material. Further details on processing conditions, such as specific wafer temperature, chamber pressure, dose, and exposure times can be any described herein.

In some embodiments, suitable SAM precursors for selectively attaching SAM precursors to silicon-and-oxygen-containing surfaces relative to silicon-and-nitrogen-containing surfaces include silanes, oxysilanes, cyclic azasilanes, and cyclic thiosilanes.

Example silanes include bis(dimethylamino)dimethylsilane (BDMADMS), N-octyldimethyl(dimethylamino)silane (ODMDMAS), and N-methyl-aza-2,2,4-trimethylsilacyclopentane (CAZ-1).

Example oxysilanes include alkoxysilanes, (3-aminopropyl)triethoxysilane, and (3-aminopropyl)trimethoxysilane).

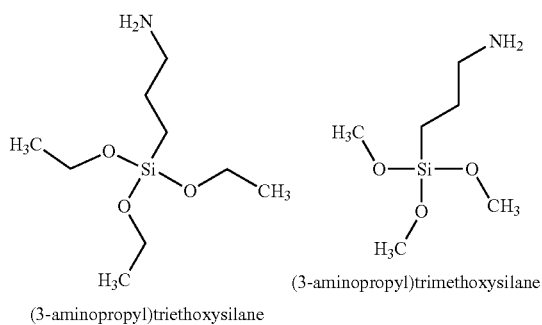

(3-aminopropyl)triethoxysilane (3-aminopropyl)trimethoxysilane

Example cyclic azasilanes include N-methyl-aza-2,2,4-trimethylsilacyclopentane and N,N-Dimethylaminopropyl-aza-2-methyl-2-methoxysilacylopentane.

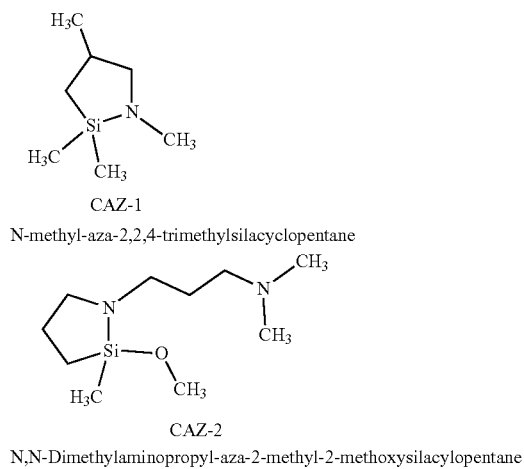

CAZ-1
N-methyl-aza-2,2,4-trimethylsilacyclopentane

CAZ-2
N,N-Dimethylaminopropyl-aza-2-methyl-2-methoxysilacylopentane

An example cyclic thiosilane includes 2,2,4-trimethyl-1-thia-2-silacyclopentane.

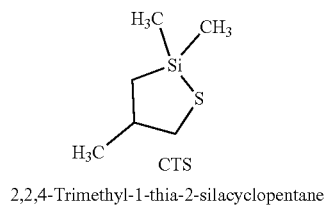

2,2,4-Trimethyl-1-thia-2-silacyclopentane

Other non-limiting SAM precursors include:

$SiR^3R^4R^5R^6$, in which each of $R^3$, $R^4$, $R^5$, and $R^6$ is or includes, independently, H, halo, or an organic moiety. In some embodiments, $R^3$, $R^4$, $R^5$, and $R^6$ is or includes, independently, H, halo, optionally substituted aliphatic, optionally substituted heteroaliphatic, optionally substituted cycloaliphatic, optionally substituted cycloheteroaliphatic, or optionally substituted aromatic. In some embodiments, $R^3$ and $R^4$ can be taken together, with the silicon atom to which each are attached, to form a cycloheteroaliphatic group or a heterocyclyl group (e.g., optionally including a nitrogen atom or a sulfur atom). In other embodiments, each of $R^3$, $R^4$, $R^5$, and/or $R^6$ can be or include, independently, H, halo, optionally substituted alkyl, optionally substituted alkenyl, optionally substituted alkynyl, optionally substituted heteroalkyl, optionally substituted heteroalkenyl, optionally substituted heteroalkynyl, optionally substituted alkoxy, optionally substituted amino, optionally substituted aminoalkyl, optionally substituted thioalkoxy, optionally substituted cycloalkyl, optionally substituted cycloheteroalkyl, optionally substituted heterocyclyl, or optionally substituted aryl. Examples of substitutions for $R^3$, $R^4$, $R^5$, and $R^6$ can include any described herein for alkyl or aryl.

Yet other non-limiting SAM precursors include:

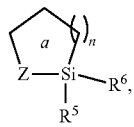

in which Z can be —S—, —O—, or —NR$^7$—; ring a can be optionally substituted; n is an integer from 1 to 5; and each of $R^5$, $R^6$, and $R^7$ is or includes, independently, H, halo, or an organic moiety. In some embodiments, each of $R^5$, $R^6$, and $R^7$ is or includes, independently, H, halo, optionally substituted aliphatic, optionally substituted heteroaliphatic, optionally substituted cycloaliphatic, optionally substituted cycloheteroaliphatic, or optionally substituted aromatic. In some embodiments, each of $R^5$, $R^6$, and $R^7$ can be or is, independently, H, halo, optionally substituted alkyl, optionally substituted alkenyl, optionally substituted alkynyl, optionally substituted heteroalkyl, optionally substituted heteroalkenyl, optionally substituted heteroalkynyl, optionally substituted alkoxy, optionally substituted amino, optionally substituted aminoalkyl, optionally substituted thioalkoxy, optionally substituted cycloalkyl, optionally substituted cycloheteroalkyl, optionally substituted heterocyclyl, or optionally substituted aryl. In particular embodiments, each of $R^5$, $R^6$, $R^7$, and substitution(s) for ring a is or includes, independently, H, halo, optionally substituted alkoxy, optionally substituted alkyl, or optionally substituted aminoalkyl. Examples of substitutions for $R^5$, $R^6$, $R^7$, and ring a can include any described herein for alkyl or aryl.

In other embodiments, the SAM precursor includes an organometallic precursor, an organometalloid precursor, or an organoselenium precursor. Such precursors can further include an aldehyde functional group (—C(O)H), a ketone functional group (e.g., —C(O)R$^1$, in which R$^1$ can be any organic moiety described herein), an isothiocyanate functional group (—NCS), or a silane functional group (e.g., —SiR$^4$R$^5$R$^6$ or >SiR$^5$R$^6$, in which non-limiting R$^4$, R$^5$, and R$^6$ are described herein). An organometallic precursor can include one or more organic moieties (e.g., any described herein) and one or more metal atoms (e.g., titanium (Ti), molybdenum (Mo), gallium (Ga), indium (In), or tin (Sn)). An organometalloid precursor can include one or more organic moieties (e.g., any described herein) and one or more metalloid atoms (e.g., silicon (Si), germanium (Ge), arsenic (As), antimony (Sb), or tellurium (Te)). An organoselenium precursor can include one or more organic moieties (e.g., any described herein) and one or more selenium (Se) atoms. In yet other embodiments, any SAM precursor herein (e.g., aldehydes, ketones, silanes, oxysilanes, cyclic azasilanes, and cyclic thiosilanes) can include one or more of the following: a metal atom (e.g., Ti, Mo, Ga, In, or Sn), a metalloid atom (e.g., Si, Ge, As, Sb, or Te), and/or Se atom.

Returning to FIG. 3C, operation 370 provides etching of the silicon-and-nitrogen-containing surface that is selective to silicon-and-oxygen-containing surface having the SAM precursors adsorbed thereon. Although ALE is described herein as an example, it will be understood that other etching processes, including continuous plasma etching, may be used instead or in combination with ALE. This etching operation can include any embodiments described herein.

Operation 370 in FIG. 3C shows three example operations that may be performed to etch the silicon-and-nitrogen-containing surface relative to the silicon-and-oxygen-containing surface using ALE. Operation 360 involves exposing the substrate to plasma reactive species that thereby deposit onto the surface of the substrate. In operation 362, the substrate may be exposed to an energy source (e.g. activating or sputtering gas or chemically reactive species that induces removal), such as argon plasma, or helium plasma, or nitrogen plasma, to remove the material from the surface of the substrate. In operation 364, operations 360 and 362 may be optionally repeated in cycles. Further details on etching processes and conditions are described herein and can be employed in the process of FIG. 3C.

Certain disclosed embodiments may be suitable for selective etching on substrates having four or more exposed surfaces of different materials.

Embodiments described herein are relevant to selective etching 4 color patterning processes, such as those described in "Atomic Layer Etching: An Industry Perspective" by Carver et al., published on Feb. 20, 2015 in ECS Journal of Solid State Science and Technology N5005-N5009 (2015), which is herein incorporate by reference in its entirety and for all purposes. For example, a 4-color patterning scheme includes four different material types and processes to selectively etch each material selective to the other materials. Introduction of SAM precursors prior to etching can be used to selectively passivate one or more color on the substrate, and thereby improve etch selectivity.

Additional SAM precursors may be used. Functionalization of inorganic surfaces are described further in "Gas Phase Organic Functionalization of $SiO_2$ with Propanoyl Chloride" by Gasvoda et al., published in Langmuir on Oct. 30, 2018, which is herein incorporate by reference in its entirety and for all purposes.

Figure 4:
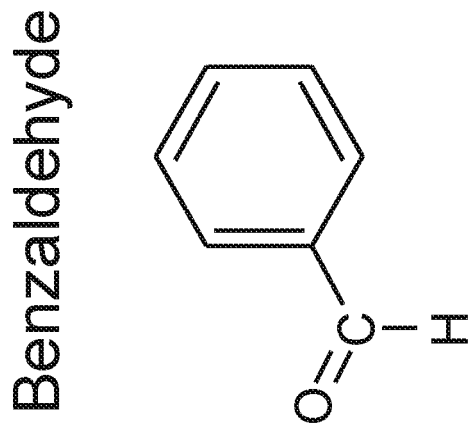
FIG. 4 depicts experimental data comparing infra-red absorbance change for silicon nitride and silicon oxide exposed to different aldehydes.
Figure 4:
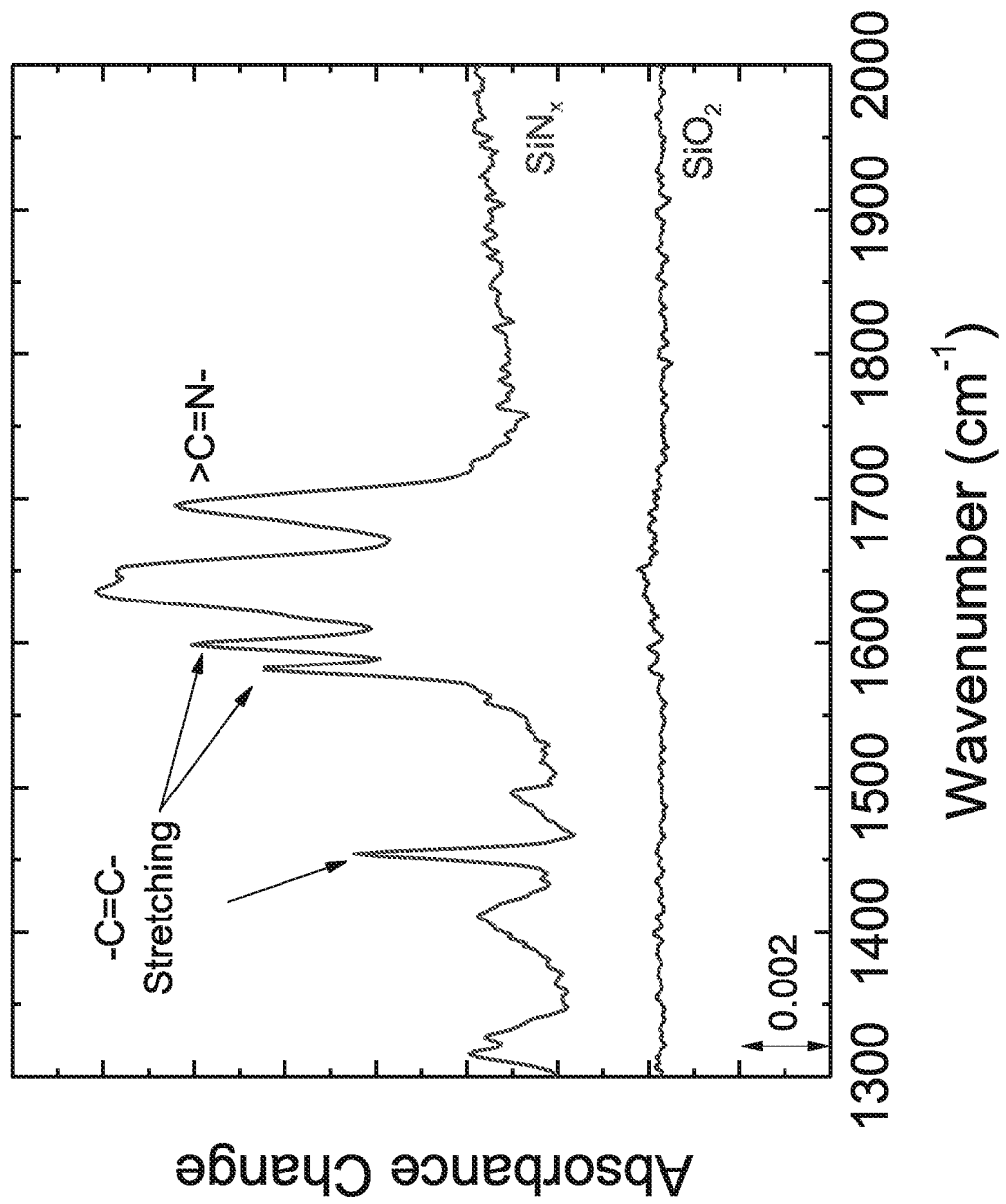

FIG. 4 shows experimental data including the infra-red absorbance change of silicon oxide and silicon nitride surfaces upon exposure to SAM precursors. The example precursor is benzaldehyde. The data demonstrates the highly selective functionalization of silicon nitride relative to silicon oxide. Without being bound by a particular theory, it is believed that benzaldehyde creates an $sp^2$ carbon-rich silicon nitride surface that reduces subsequent etching of the silicon nitride material, thereby resulting in improved etch selectivity relative to silicon oxide.

Figure 5:
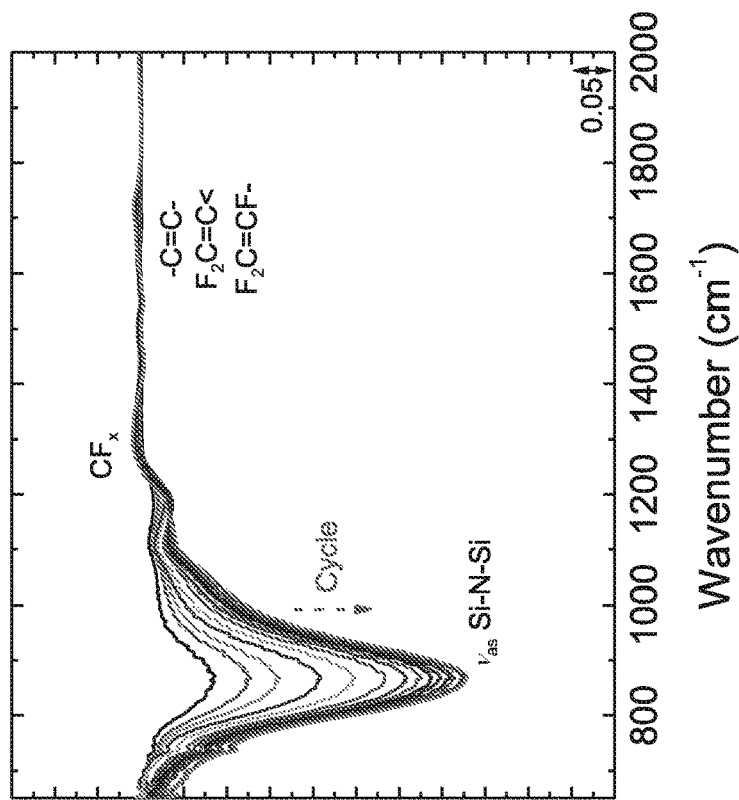
FIG. 5 depicts experimental data showing infra-red absorbance change for silicon nitride exposed to cycles of atomic layer etch and silicon nitride functionalized with benzaldehyde exposed to cycles of atomic layer etch.
Figure 5:
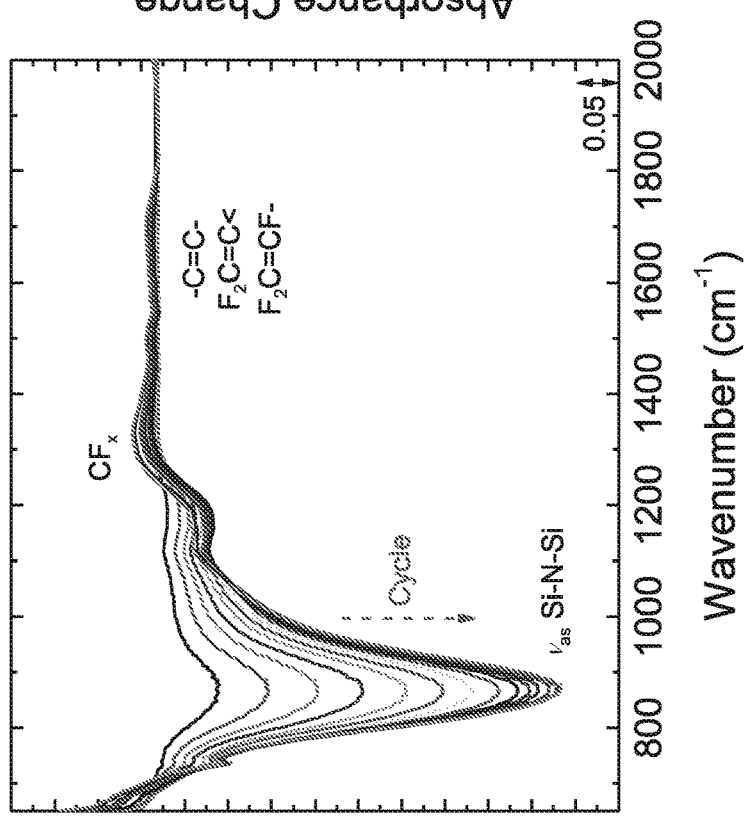

FIG. 5 shows experimental data of infra-red absorbance change for silicon nitride materials without benzaldehyde precursors thereon (left) and with benzaldehyde precursors thereon (right) as a function of ALE cycles. The successive reduction in Si—N—Si absorbance around 870 $cm^{-1}$ indicate the silicon nitride etches in the initial cycles, with successively less etch as cycles proceed. The increase in $CF_x$ absorbance at around 1300 $cm^{-1}$ confirms the buildup of carbon-based passivation which causes the successive reduction in etching. The data indicates the silicon nitride material having benzaldehyde precursors is etched less than the silicon nitride material without the benzaldehyde precursors.

Figure 6:
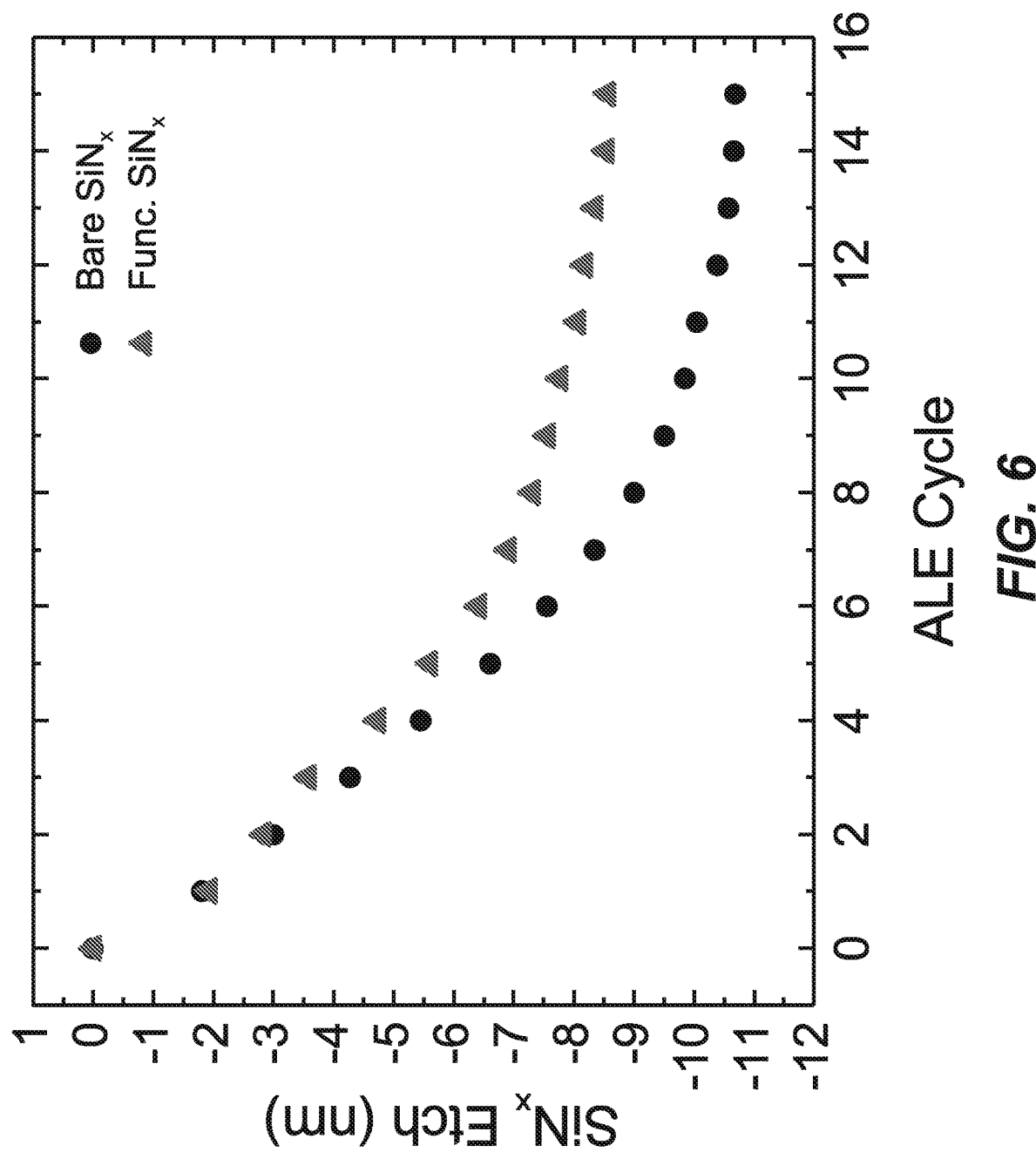
FIG. 6 shows relative amounts of removal for silicon nitride versus silicon nitride functionalized with benzaldehyde as a function of atomic layer etching cycles.

FIG. 6 shows experimental ellipsometry data of the silicon nitride etched as a function of ALE cycles. The data includes a bare, nonfunctionalized silicon nitride surface exposed to a $CF_x$ ALE process (circles), as well as a benzaldehyde-functionalized silicon nitride surface exposed to the same etch process (triangles). Benzaldehyde functionalization on silicon nitride surfaces resulted in etching of only 8.5 nm in 15 cycles, as compared to non-functionalized silicon nitride surface resulting in etching of 10.5 nm. Such results suggest that benzaldehyde is a good SAM candidate for potentially achieving significantly reduced silicon nitride loss when exposed to etch chemistries used to etch silicon oxide. Under these conditions it is expected that the silicon oxide surface will be effectively etched by the ALE process, independent of the SAM precursor treatment.

Figure 7:
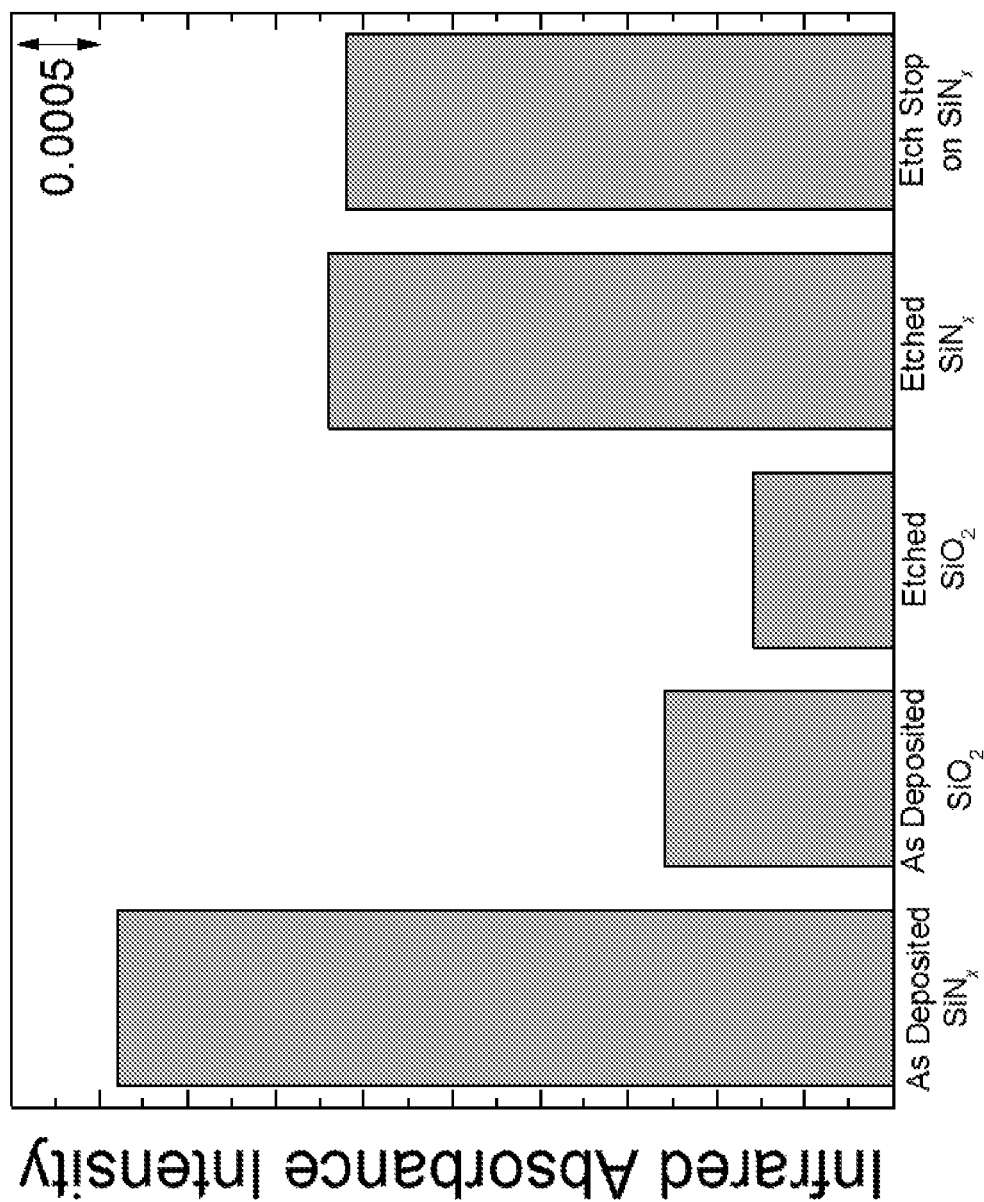
FIG. 7 depicts experimental data comparing infra-red absorbance intensity, which measures benzaldehyde uptake on different surfaces.

FIG. 7 shows infra-red absorbance intensity of the —C═C— stretching vibrational mode at around 1630 $cm^{-1}$, which measures the uptake of benzaldehyde on the surface. Five different surfaces were compared: as deposited $SiN_x$, as deposited $SiO_2$, etched $SiO_2$, etched $SiN_x$, and an etched $SiN_x$ film with a thicker polymer layer causing an etch stop. Results indicate that fluorocarbon-based atomic layer etching of $SiO_2$ and $SiN_x$ does not change the basic selectivity of benzaldehyde, which allows it to attach preferentially to $SiN_x$. Under these conditions, it is expected that the SAM precursor will display selectivity for a silicon-and-nitrogen-containing surface, whether provided as an as-deposited surface or an etched surface, as compared to a silicon-and-oxygen-containing surface.

Figure 8:
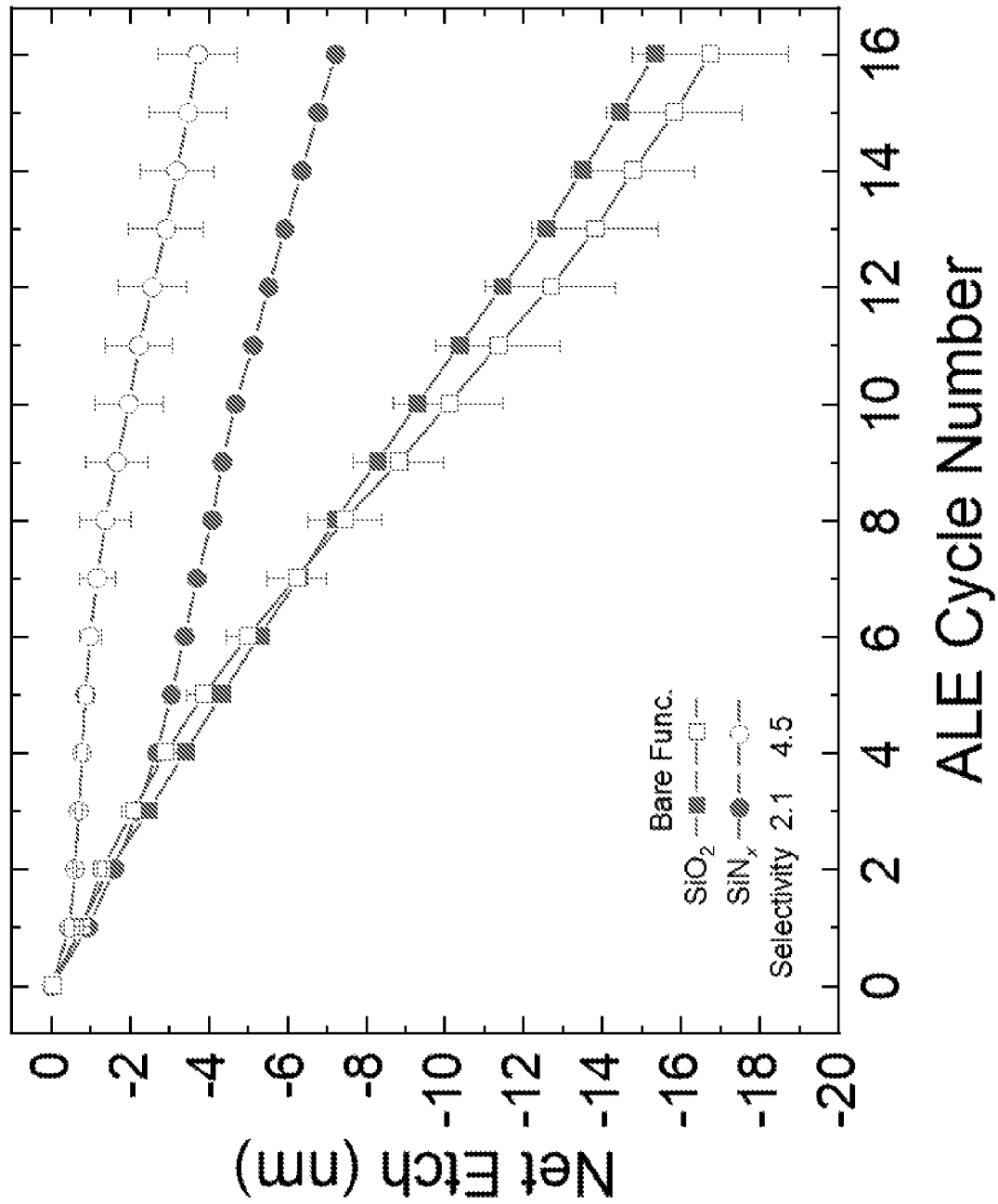
FIG. 8 shows change in film thickness for silicon oxide and silicon nitride surfaces that are bare or functionalized with benzaldehyde. Net etch is provided as a function of atomic layer etching cycles.

FIG. 8 shows change in film thickness for $SiO_2$ and $SiN_x$ as measured by ellipsometry, as a function of increasing number of ALE cycles. The solid symbols represent ALE on bare, nonfunctionalized $SiO_2$ and $SiN_x$ surfaces; and the open symbols are from ALE on benzaldehyde-exposed $SiO_2$ and $SiN_x$. The calculated selectivity for a target etch of ~15 nm of $SiO_2$ is included in the legend for both cases. Selectivity is more than 2× higher for the case in which surfaces are pre-exposed to benzaldehyde. As can be seen, use of a SAM precursor can provide selectivity improvement, as compared to a non-functionalized surface.

Figure 9A:
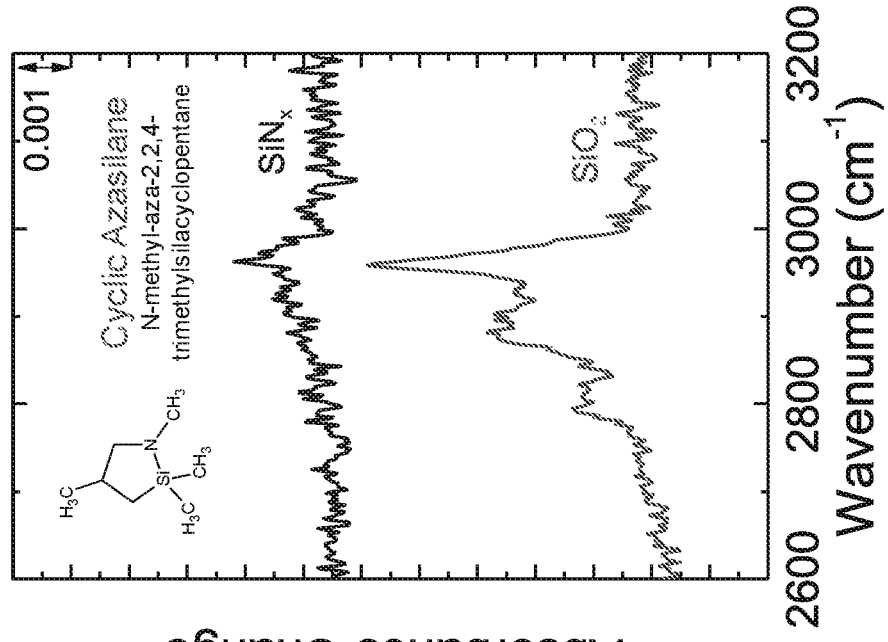
FIG. 9A-9B depicts experimental data comparing infra-red absorbance change for silicon nitride and silicon oxide exposed to (A) a non-limiting aldehyde (3,5,5-trimethylhexanal) and (B) a non-limiting cyclic azasilane (N-methyl-aza-2,2,4-trimethylsilacyclopentane).
Figure 9B:
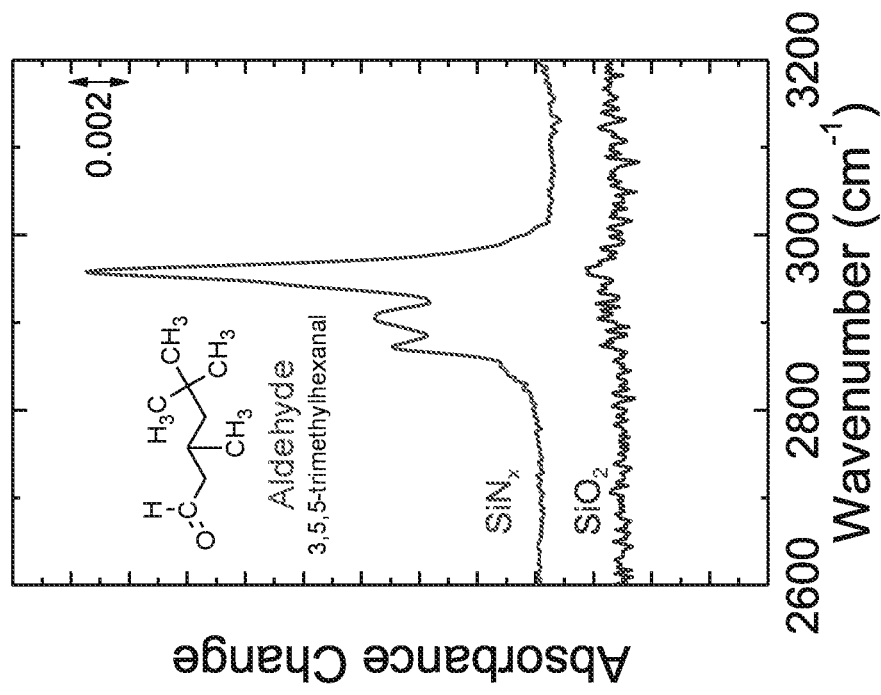

FIG. 9A-9B shows experimental data including the infra-red absorbance change of silicon oxide and silicon nitride surfaces upon exposure to particular SAM precursors. In FIG. 9A, the example precursor is 3,5,5-trimethylhexanal. The data demonstrates the highly selective functionalization of silicon nitride relative to silicon oxide. In FIG. 9B, the example precursor is N-methyl-aza-2,2,4-trimethylsilacyclopentane, which preferentially attaches to silicon oxide relative to silicon nitride. As silicon nitride surfaces are known to oxidize upon atmospheric pressure, some attachment of the cyclic azasilanes was observed upon the silicon nitride surface. Under these conditions, it is still expected that the silicon nitride surface will be preferentially etched relative to the silicon oxide surface.

Apparatus

Plasma reactors which, in certain embodiments, may be suitable for atomic layer etching (ALE) operations are now described. Example ICP reactors are also described in U.S. Patent Application Publication No. 2014/0170853, filed Dec. 10, 2013, and titled "IMAGE REVERSAL WITH AHM GAP FILL FOR MULTIPLE PATTERNING," which is hereby incorporated by reference in its entirety and for all purposes. Although ICP reactors are described herein, in some embodiments, it should be understood that capacitively coupled plasma reactors may also be used.

Figure 10:
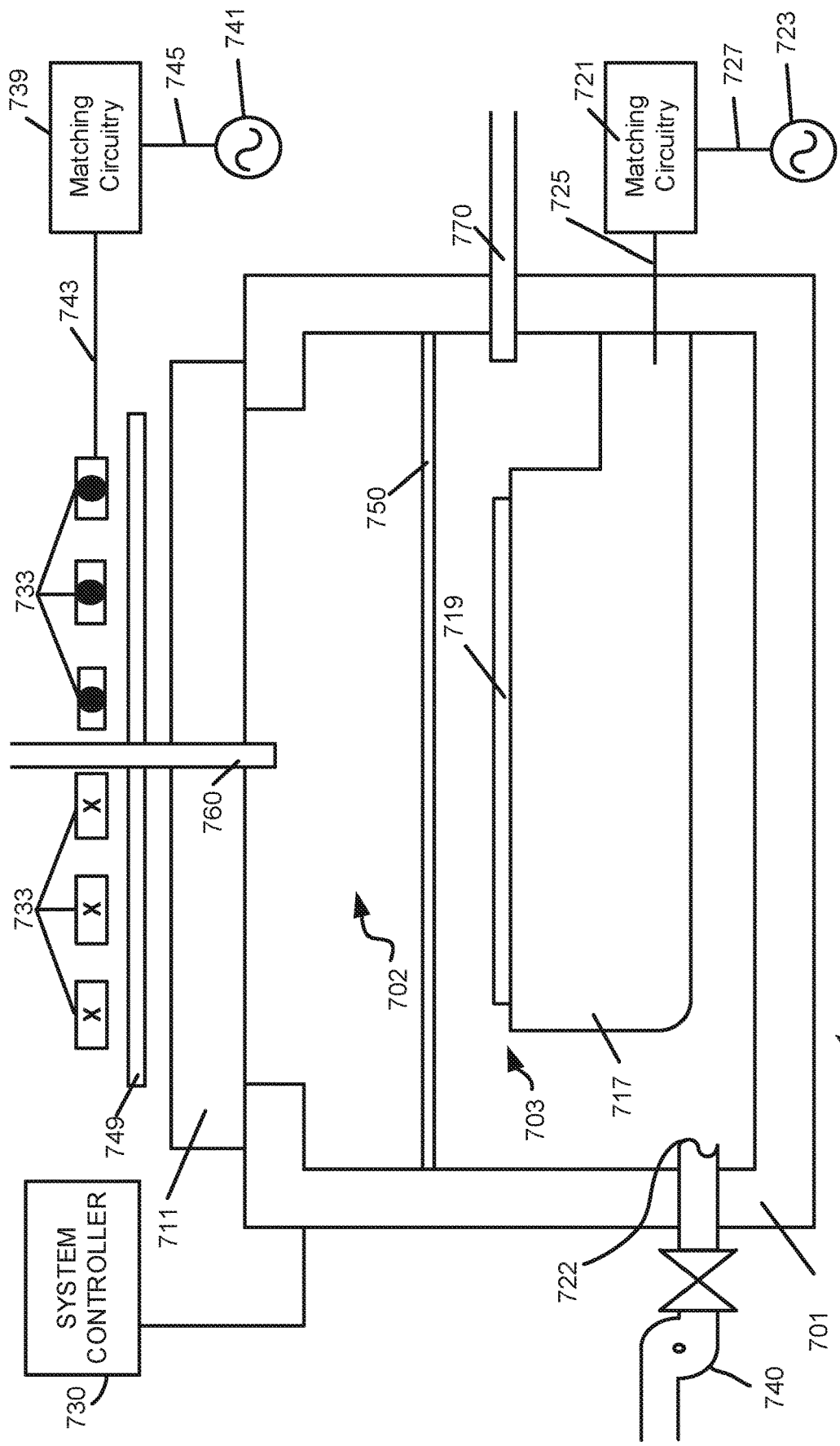
FIG. 10 depicts example reactors that may be used to perform processes described herein according to certain embodiments.

FIG. 10 schematically shows a cross-sectional view of an inductively coupled plasma integrated etching and deposition apparatus 700 appropriate for implementing certain embodiments herein, an example of which is a Kiyo™ reactor, produced by Lam Research Corp. of Fremont, CA The inductively coupled plasma apparatus 700 includes an overall process chamber 701 structurally defined by chamber walls 701 and a window 711. The chamber walls 701 may be fabricated from stainless steel or aluminum. The window 711 may be fabricated from quartz or other dielectric material. An optional internal plasma grid 750 divides the overall processing chamber 701 into an upper sub-chamber 702 and a lower sub-chamber 703. In most embodiments, plasma grid 750 may be removed, thereby utilizing a chamber space made of sub-chambers 702 and 703. A chuck 717 is positioned within the lower sub-chamber 703 near the bottom inner surface. The chuck 717 is configured to receive and hold a semiconductor wafer 719 upon which the etching and deposition processes are performed. The chuck 717 can be an electrostatic chuck for supporting the wafer 719 when present. In some embodiments, an edge ring (not shown) surrounds chuck 717, and has an upper surface that is approximately planar with a top surface of a wafer 719, when present over chuck 717. The chuck 717 also includes electrostatic electrodes for chucking and dechucking the wafer. A filter and DC clamp power supply (not shown) may be provided for this purpose. Other control systems for lifting the wafer 719 off the chuck 717 can also be provided. The chuck 717 can be electrically charged using an RF power supply 723. The RF power supply 723 is connected to matching circuitry 721 through a connection 727. The matching circuitry 721 is connected to the chuck 717 through a connection 725. In this manner, the RF power supply 723 is connected to the chuck 717.

Elements for plasma generation include a coil 733 is positioned above window 711. In some embodiments, a coil is not used in disclosed embodiments. The coil 733 is fabricated from an electrically conductive material and includes at least one complete turn. The example of a coil 733 shown in FIG. 10 includes three turns. The cross-sections of coil 733 are shown with symbols, and coils having an "X" extend rotationally into the page, while coils having a "●" extend rotationally out of the page. Elements for plasma generation also include an RF power supply 741 configured to supply RF power to the coil 733. In general, the RF power supply 741 is connected to matching circuitry 739 through a connection 745. The matching circuitry 739 is connected to the coil 733 through a connection 743. In this manner, the RF power supply 741 is connected to the coil 733. An optional Faraday shield 749 is positioned between the coil 733 and the window 711. The Faraday shield 749 is maintained in a spaced apart relationship relative to the coil 733. The Faraday shield 749 is disposed immediately above the window 711. The coil 733, the Faraday shield 749, and the window 711 are each configured to be substantially parallel to one another. The Faraday shield may prevent metal or other species from depositing on the dielectric window of the plasma chamber 701.

Process gases (e.g., nitrogen, hydrogen, argon, SAM precursors such as aldehydes and isothiocyanates, fluorocarbons, etc.) may be flowed into the processing chamber 701 through one or more main gas flow inlets 760 positioned in the upper chamber 702 and/or through one or more side gas flow inlets 770. Likewise, though not explicitly shown, similar gas flow inlets may be used to supply process gases to a capacitively coupled plasma processing chamber. A vacuum pump, e.g., a one or two stage mechanical dry pump and/or turbomolecular pump 740, may be used to draw process gases out of the process chamber 701 and to maintain a pressure within the process chamber 701. For example, the pump may be used to evacuate the chamber 701 during a purge operation of ALD. A valve-controlled conduit may be used to fluidically connect the vacuum pump to the processing chamber 701 so as to selectively control application of the vacuum environment provided by the vacuum pump. This may be done employing a closed-loop-controlled flow restriction device, such as a throttle valve (not shown) or a pendulum valve (not shown), during operational plasma processing. Likewise, a vacuum pump and valve controlled fluidic connection to the capacitively coupled plasma processing chamber may also be employed.

During operation of the apparatus, one or more process gases may be supplied through the gas flow inlets 760 and/or 770. In certain embodiments, process gas may be supplied only through the main gas flow inlet 760, or only through the side gas flow inlet 770. In some cases, the gas flow inlets shown in the figure may be replaced more complex gas flow inlets, one or more showerheads, for example. The Faraday shield 749 and/or optional grid 750 may include internal channels and holes that allow delivery of process gases to the chamber 701. Either or both of Faraday shield 749 and optional grid 750 may serve as a showerhead for delivery of process gases. In some embodiments, a liquid vaporization and delivery system may be situated upstream of the chamber 701, such that once a liquid reactant or precursor is vaporized, the vaporized reactant or precursor is introduced into the chamber 701 via a gas flow inlet 760 and/or 770.

Radio frequency power is supplied from the RF power supply 741 to the coil 733 to cause an RF current to flow through the coil 733. The RF current flowing through the coil 733 generates an electromagnetic field about the coil 733. The electromagnetic field generates an inductive current within the upper sub-chamber 702. The physical and chemical interactions of various generated ions and radicals with the wafer 719 selectively etch features of and deposit layers on the wafer.

If the plasma grid is used such that there is both an upper sub-chamber 702 and a lower sub-chamber 703, the inductive current acts on the gas present in the upper sub-chamber 702 to generate an electron-ion plasma in the upper sub-chamber 702. The optional internal plasma grid 750 limits the amount of hot electrons in the lower sub-chamber 703. In some embodiments, the apparatus is designed and operated such that the plasma present in the lower sub-chamber 703 is an ion-ion plasma.

Both the upper electron-ion plasma and the lower ion-ion plasma may contain positive and negative ions, though the ion-ion plasma will have a greater ratio of negative ions to positive ions. Volatile etching and/or deposition byproducts may be removed from the lower-sub-chamber 703 through port 722. The chuck 717 disclosed herein may operate at elevated temperatures ranging between about 10° C. and about 250° C. The temperature will depend on the process operation and specific recipe.

In general, ICP or CCP reactors may include chambers used in various facilities. Chamber 701 may be coupled to facilities (not shown) when installed in a clean room or a fabrication facility. Facilities include plumbing that provide processing gases, vacuum, temperature control, and environmental particle control. These facilities are coupled to chamber 701, when installed in the target fabrication facility. Additionally, chamber 701 may be coupled to a transfer chamber that allows robotics to transfer semiconductor wafers into and out of chamber 701 using typical automation.

Suitable controllers having the below characteristics may be used in conjunction with both ICP plasma reactors such as depicted in FIG. 10 as well as other plasma reactors. In some embodiments, a system controller 730 (which may include one or more physical or logical controllers) controls some or all of the operations of a processing chamber. The system controller 730 may include one or more memory devices and one or more processors. In some embodiments, the apparatus includes a switching system for controlling flow rates and durations when disclosed embodiments are performed. In some embodiments, the apparatus may have a switching time of greater than about 50 ms, or up to about 500 ms. Switching time may depend on the flow chemistry, recipe chosen, reactor architecture, hardware control systems, and other factors.

In some implementations, a controller 730 is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 730, depending on the processing parameters and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller 730 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller 730, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller 730 receives instructions in the form of data, which specify parameters for each of the processing steps to be performed during one or more operations. It should be understood that the parameters may be specific to the type of process to be performed and the type of tool that the controller is configured to interface with or control. Thus as described above, the controller 730 may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an ALE chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Figure 11:
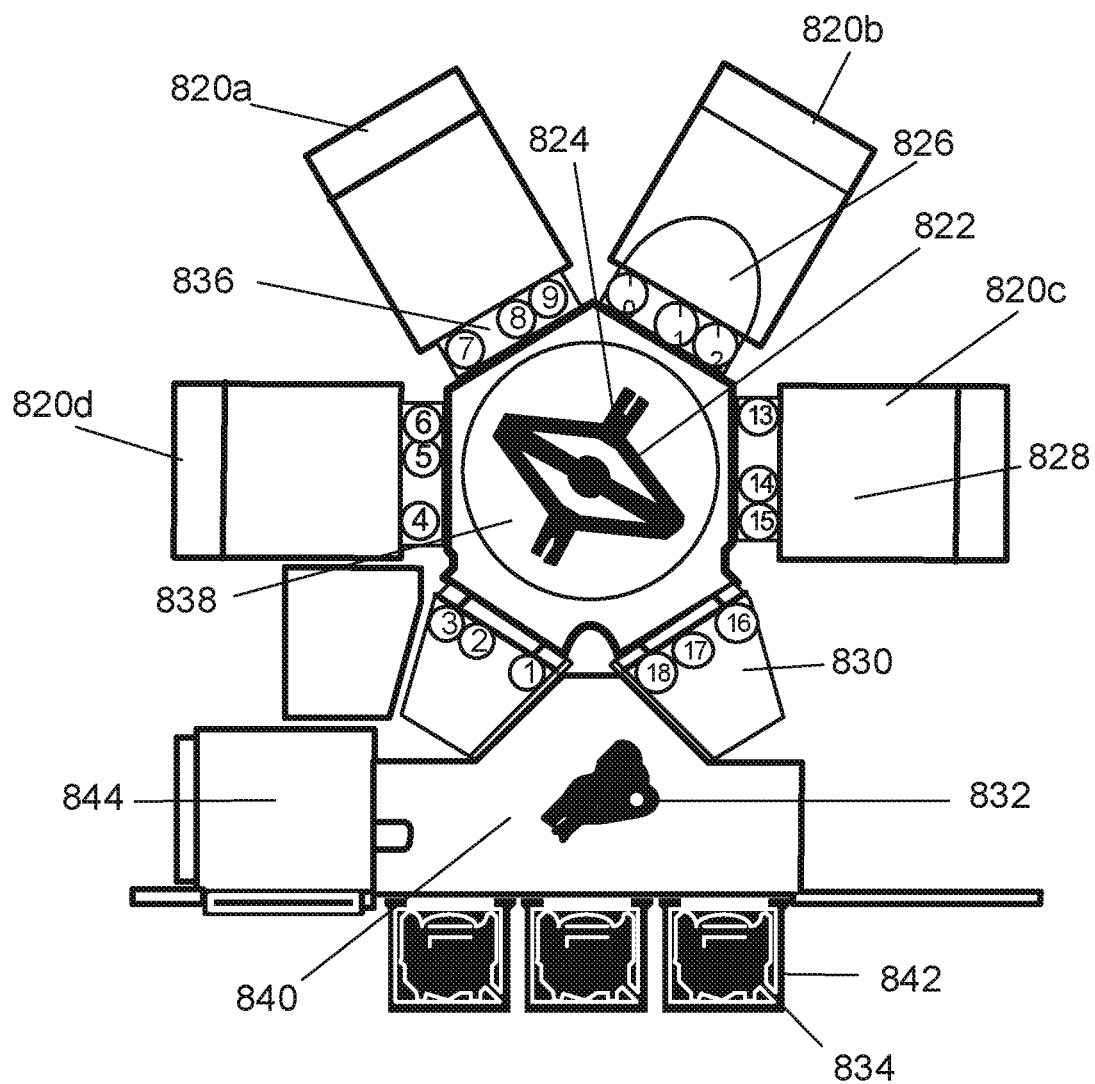
FIG. 11 shows a multi-station apparatus that may be used to perform the processes in certain implementations.

FIG. 11 depicts a semiconductor process cluster architecture with various modules that interface with a vacuum transfer module 838 (VTM). The arrangement of transfer modules to "transfer" wafers among multiple storage facilities and processing modules may be referred to as a "cluster tool architecture" system. Airlock 830, also known as a loadlock or transfer module, is shown in VTM 838 with four processing modules 820a-820d, which may be individual optimized to perform various fabrication processes. By way of example, processing modules 820a-820d may be implemented to perform substrate etching, deposition, ion implantation, wafer cleaning, sputtering, and/or other semiconductor processes. In some embodiments, exposure to the SAM precursor and ALE are performed in the same module. In some embodiments, exposure to the SAM precursor and ALE are performed in different modules of the same tool. One or more of the substrate etching processing modules (any of 820a-820d) may be implemented as disclosed herein, i.e., for depositing conformal films, selectively depositing films by ALD, etching patterns, and other suitable functions in accordance with the disclosed embodiments. Airlock 830 and process modules 820a-820d may be referred to as "stations." Each station has a facet 836 that interfaces the station to VTM 838. Inside each facet, sensors 1-18 are used to detect the passing of wafer 826 when moved between respective stations.

Robot 822 transfers wafer 826 between stations. In one embodiment, robot 822 has one arm, and in another embodiment, robot 822 has two arms, where each arm has an end effector 824 to pick wafers such as wafer 826 for transport. Front-end robot 832, in atmospheric transfer module (ATM) 840, is used to transfer wafers 826 from cassette or Front Opening Unified Pod (FOUP) 834 in Load Port Module (LPM) 842 to airlock 830. Module center 828 inside process modules 820*a*-820*d* is one location for placing wafer 826. Aligner 844 in ATM 840 is used to align wafers.

In an exemplary processing method, a wafer is placed in one of the FOUPs 834 in the LPM 842. Front-end robot 832 transfers the wafer from the FOUP 834 to an aligner 844, which allows the wafer 826 to be properly centered before it is etched or processed. After being aligned, the wafer 826 is moved by the front-end robot 832 into an airlock 830. Because airlock modules have the ability to match the environment between an ATM and a VTM, the wafer 826 is able to move between the two pressure environments without being damaged. From the airlock module 830, the wafer 826 is moved by robot 822 through VTM 838 and into one of the process modules 820*a*-820*d*. In order to achieve this wafer movement, the robot 822 uses end effectors 824 on each of its arms. Once the wafer 826 has been processed, it is moved by robot 822 from the process modules 820*a*-820*d* to an airlock module 830. From here, the wafer 826 may be moved by the front-end robot 832 to one of the FOUPs 834 or to the aligner 844.

It should be noted that the computer controlling the wafer movement can be local to the cluster architecture, or can be located external to the cluster architecture in the manufacturing floor, or in a remote location and connected to the cluster architecture via a network. A controller as described above with respect to FIG. 10 may be implemented with the tool in FIG. 11.

Figure 12A:
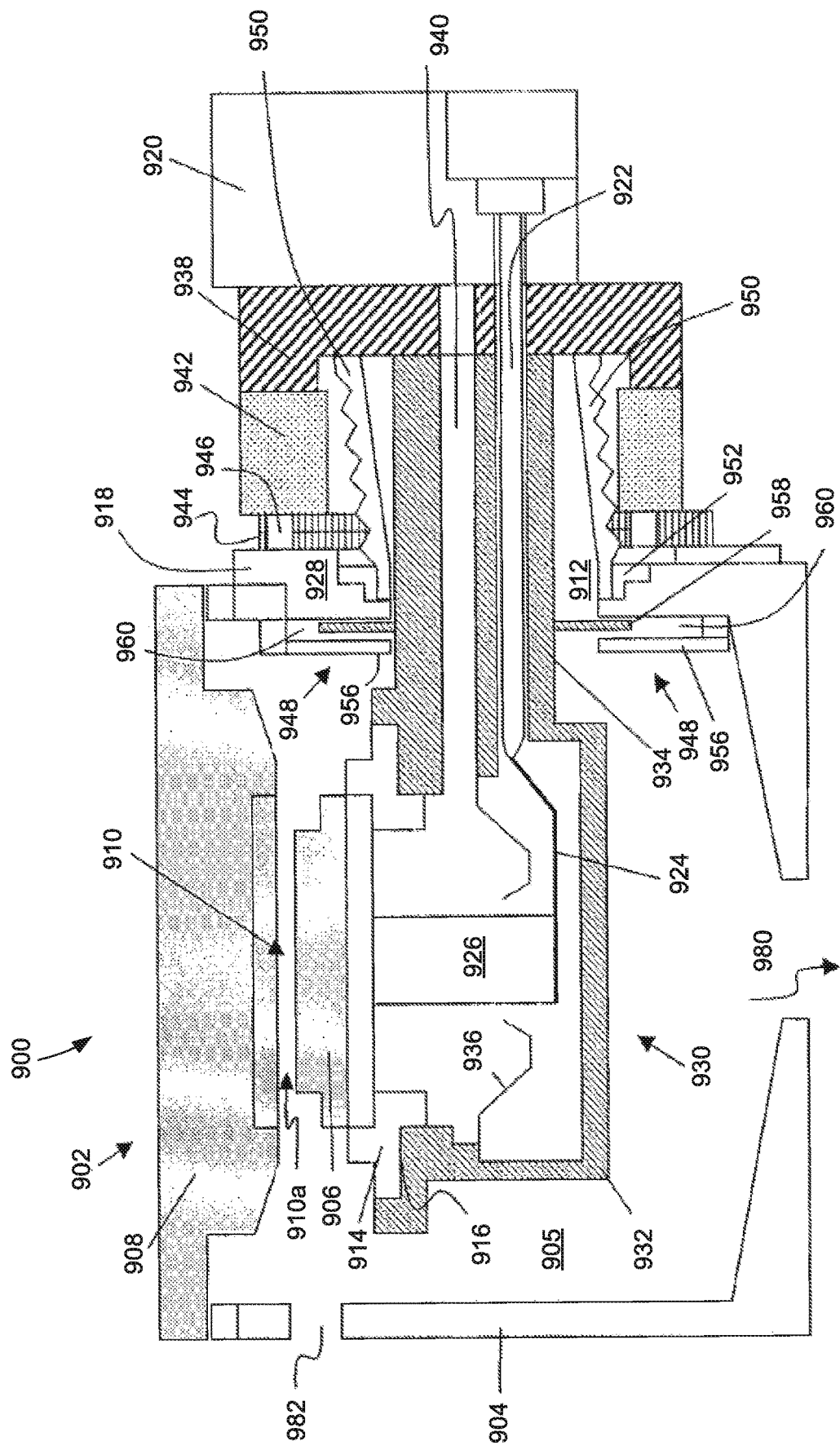
FIG. 12A-12C depicts further example reactors that may be used to perform processes described herein according to certain embodiments.
Figure 12B:
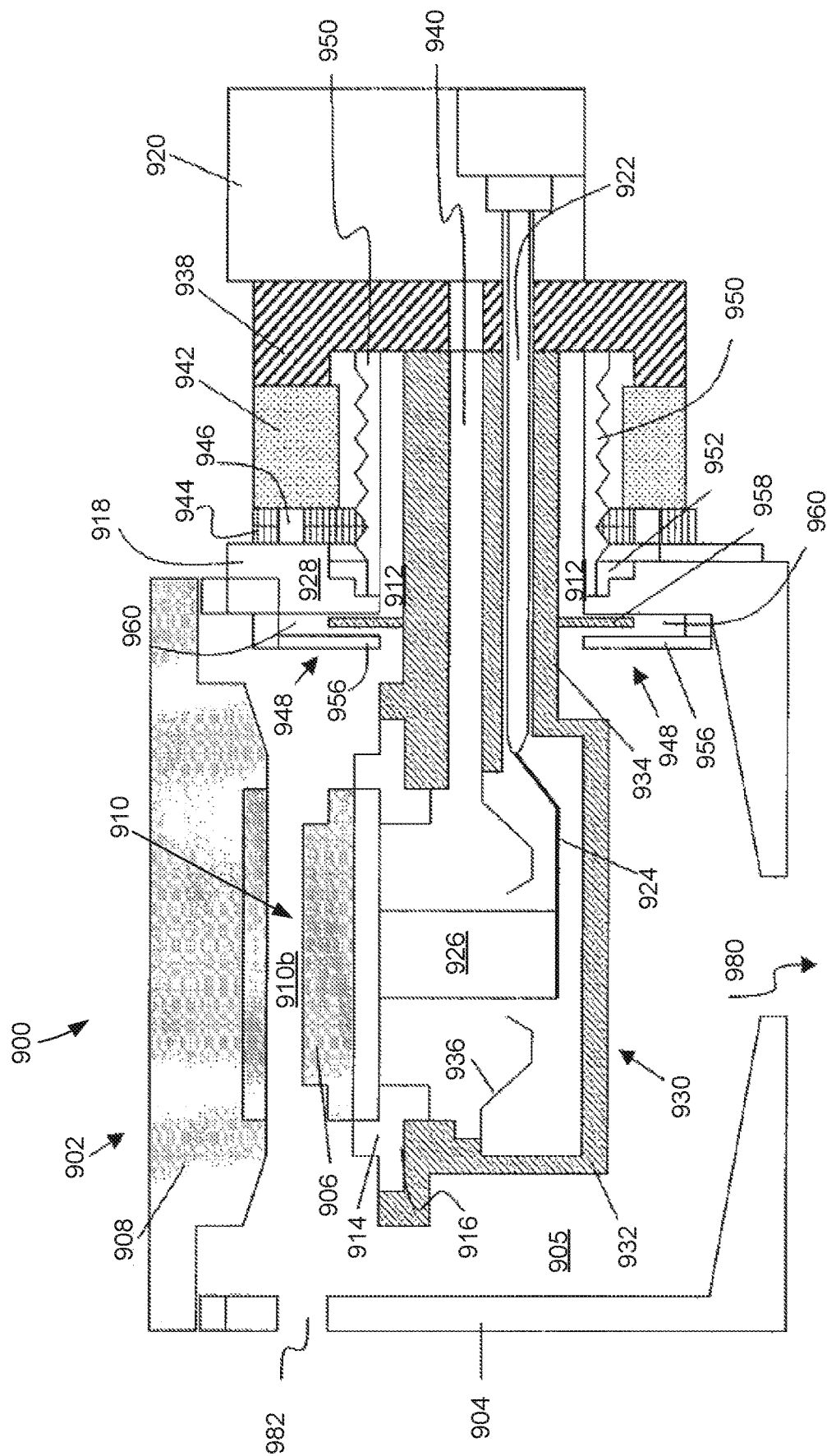
Figure 12C:
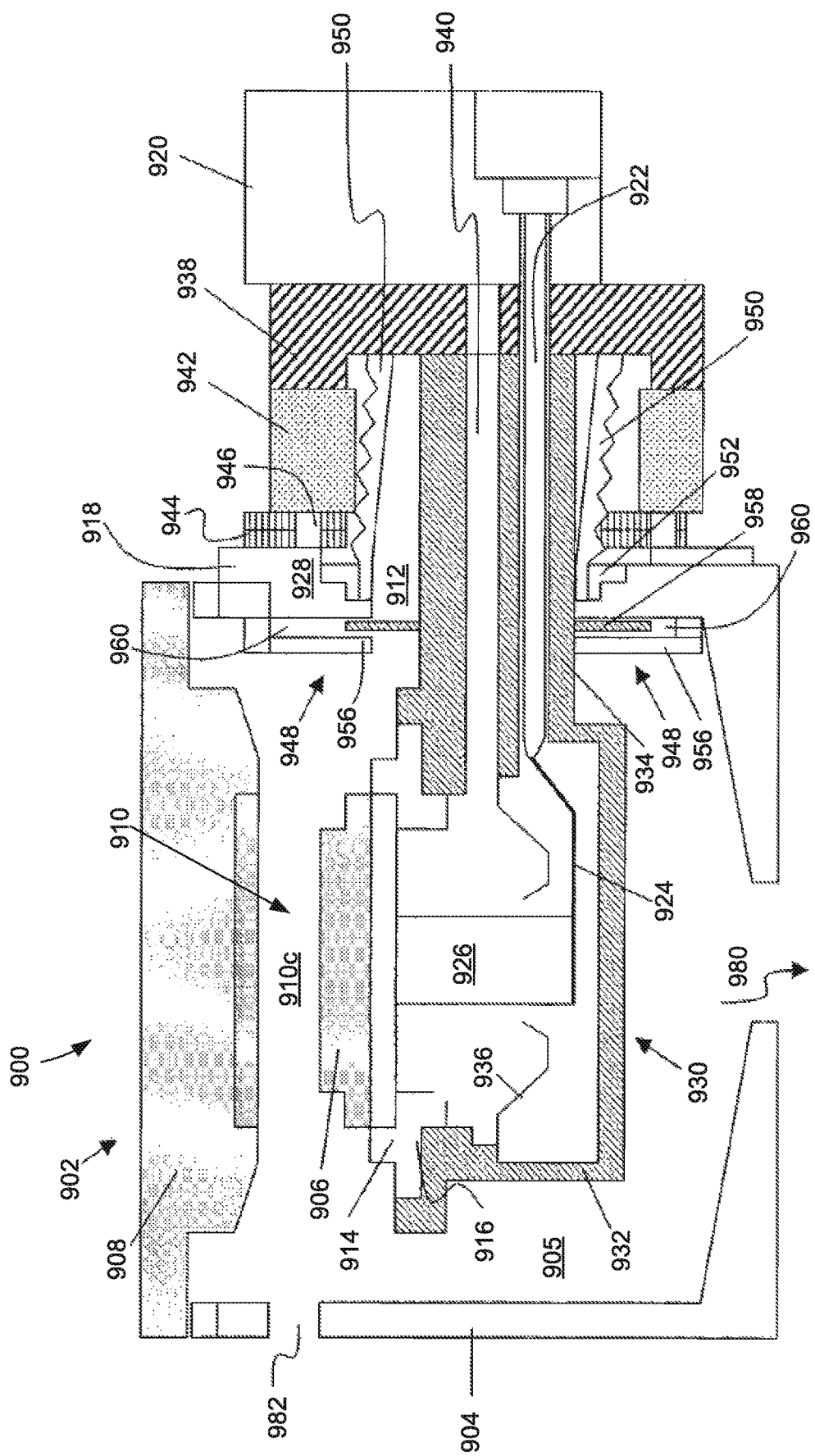

FIGS. 12A-12C illustrate an embodiment of an adjustable gap capacitively coupled confined RF plasma reactor 900 that may be used for performing the etching operations described herein. As depicted, a vacuum chamber 902 includes a chamber housing 904, surrounding an interior space housing a lower electrode 906. In an upper portion of the chamber 902 an upper electrode 908 is vertically spaced apart from the lower electrode 906. Planar surfaces of the upper and lower electrodes 908, 906 are substantially parallel and orthogonal to the vertical direction between the electrodes. Preferably the upper and lower electrodes 908, 906 are circular and coaxial with respect to a vertical axis. A lower surface of the upper electrode 908 faces an upper surface of the lower electrode 906. The spaced apart facing electrode surfaces define an adjustable gap 910 therebetween. During operation, the lower electrode 906 is supplied RF power by an RF power supply (match) 920. RF power is supplied to the lower electrode 906 though an RF supply conduit 922, an RF strap 924 and an RF power member 926. A grounding shield 936 may surround the RF power member 926 to provide a more uniform RF field to the lower electrode 906. As described in commonly-owned U.S. Pat. No. 7,732,728, the entire contents of which are herein incorporated by reference, a wafer is inserted through wafer port 982 and supported in the gap 910 on the lower electrode 906 for processing, a process gas is supplied to the gap 910 and excited into plasma state by the RF power. The upper electrode 908 can be powered or grounded.

In the embodiment shown in FIGS. 12A-12C, the lower electrode 906 is supported on a lower electrode support plate 916. An insulator ring 914 interposed between the lower electrode 906 and the lower electrode Support plate 916 insulates the lower electrode 906 from the support plate 916.

An RF bias housing 930 supports the lower electrode 906 on an RF bias housing bowl 932. The bowl 932 is connected through an opening in a chamber wall plate 918 to a conduit support plate 938 by an arm 934 of the RF bias housing 930. In a preferred embodiment, the RF bias housing bowl 932 and RF bias housing arm 934 are integrally formed as one component, however, the arm 934 and bowl 932 can also be two separate components bolted or joined together.

The RF bias housing arm 934 includes one or more hollow passages for passing RF power and facilities, such as gas coolant, liquid coolant, RF energy, cables for lift pin control, electrical monitoring and actuating signals from outside the vacuum chamber 902 to inside the vacuum chamber 902 at a space on the backside of the lower electrode 906. A facilities conduit 940 provides a passageway for facility components. Further details of the facility components are described in U.S. Pat. Nos. 5,948,704 and 7,732,728 and are not shown here for simplicity of description. The gap 910 is preferably surrounded by a confinement ring assembly or shroud (not shown), details of which can be found in commonly owned published U.S. Pat. No. 7,740,736 herein incorporated by reference. The interior of the vacuum chamber 902 is maintained at a low pressure by connection to a vacuum pump through vacuum portal 980.

The conduit support plate 938 is attached to an actuation mechanism 942. Details of an actuation mechanism are described in commonly-owned U.S. Pat. No. 7,732,728 incorporated herein by above. The actuation mechanism 942, such as a servo mechanical motor, stepper motor or the like is attached to a vertical linear bearing 944, for example, by a screw gear 946 such as a ball screw and motor for rotating the ball screw. During operation to adjust the size of the gap 910, the actuation mechanism 942 travels along the vertical linear bearing 944. FIG. 12A illustrates the arrangement when the actuation mechanism 942 is at a high position on the linear bearing 944 resulting in a small gap 910 *a*. FIG. 12B illustrates the arrangement when the actuation mechanism 942 is at a mid position on the linear bearing 944. As shown, the lower electrode 906, the RF bias housing 930, the conduit support plate 938, the RF power supply 920 have all moved lower with respect to the chamber housing 904 and the upper electrode 908, resulting in a medium size gap 910*b*.

FIG. 12C illustrates a large gap 910*c* when the actuation mechanism 942 is at a low position on the linear bearing. Preferably, the upper and lower electrodes 908, 906 remain co-axial during the gap adjustment and the facing surfaces of the upper and lower electrodes across the gap remain parallel.

This embodiment allows the gap 910 between the lower and upper electrodes 906, 908 in the CCP chamber 902 during multi-step process recipes (BARC, HARC, and STRIP etc.) to be adjusted, for example, in order to maintain uniform etch across a large diameter substrate such as 300 mm wafers or flat panel displays. In particular, this chamber pertains to a mechanical arrangement that permits the linear motion used to provide the adjustable gap between lower and upper electrodes 906, 908.

FIG. 12A illustrates laterally deflected bellows 950 sealed at a proximate end to the conduit support plate 938 and at a distal end to a stepped flange 928 of chamber wall plate 918. The inner diameter of the stepped flange defines an opening 912 in the chamber wall plate 918 through which the RF bias housing arm 934 passes. The distal end of the bellows 950 is clamped by a clamp ring 952.

The laterally deflected bellows 950 provides a vacuum seal while allowing vertical movement of the RF bias housing 930, conduit support plate 938 and actuation mechanism 942. The RF bias housing 930, conduit support plate 938 and actuation mechanism 942 can be referred to as a cantilever assembly. Preferably, the RF power supply 920 moves with the cantilever assembly and can be attached to the conduit support plate 938. FIG. 12B shows the bellows 950 in a neutral position when the cantilever assembly is at a mid position. FIG. 12C shows the bellows 950 laterally deflected when the cantilever assembly is at a low position.

A labyrinth seal 948 provides a particle barrier between the bellows 950 and the interior of the plasma processing chamber housing 904. A fixed shield 956 is immovably attached to the inside inner wall of the chamber housing 904 at the chamber wall plate 918 so as to provide a labyrinth groove 960 (slot) in which a movable shield plate 958 moves vertically to accommodate vertical movement of the cantilever assembly. The outer portion of the movable shield plate 958 remains in the slot at all vertical positions of the lower electrode 906.

In the embodiment shown, the labyrinth seal 948 includes a fixed shield 956 attached to an inner surface of the chamber wall plate 918 at a periphery of the opening 912 in the chamber wall plate 918 defining a labyrinth groove 960. The movable shield plate 958 is attached and extends radially from the RF bias housing arm 934 where the arm 934 passes through the opening 912 in the chamber wall plate 918. The movable shield plate 958 extends into the labyrinth groove 960 while spaced apart from the fixed shield 956 by a first gap and spaced apart from the interior surface of the chamber wall plate 918 by a second gap allowing the cantilevered assembly to move vertically. The labyrinth seal 948 blocks migration of particles spalled from the bellows 950 from entering the vacuum chamber interior 905 and blocks radicals from process gas plasma from migrating to the bellows 950 where the radicals can form deposits which are subsequently spalled.

FIG. 12A shows the movable shield plate 958 at a higher position in the labyrinth groove 960 above the RF bias housing arm 934 when the cantilevered assembly is in a high position (small gap 910a). FIG. 12C shows the movable shield plate 958 at a lower position in the labyrinth groove 960 above the RF bias housing arm 934 when the cantilevered assembly is in a low position (large gap 910c). FIG. 12B shows the movable shield plate 958 in a neutral or mid position within the labyrinth groove 960 when the cantilevered assembly is in a mid position (medium gap 910b). While the labyrinth seal 948 is shown as symmetrical about the RF bias housing arm 934, in other embodiments the labyrinth seal 948 may be asymmetrical about the RF bias arm 934.

Definitions

By "aliphatic" is meant a hydrocarbon group having at least one carbon atom to 50 carbon atoms ($C_{1-50}$), such as one to 25 carbon atoms ($C_{1-25}$), or one to ten carbon atoms ($C_{1-10}$), and which includes alkanes (or alkyl), alkenes (or alkenyl), alkynes (or alkynyl), including cyclic versions thereof, and further including straight- and branched-chain arrangements, and all stereo and position isomers as well. Such an aliphatic can be unsubstituted or substituted with one or more groups, such as groups described herein for an alkyl group.

By "alkenyl" is meant an unsaturated monovalent hydrocarbon having at least two carbon atom to 50 carbon atoms ($C_{2-50}$), such as two to 25 carbon atoms ($C_{2-25}$), or two to ten carbon atoms ($C_{2-10}$), and at least one carbon-carbon double bond, wherein the unsaturated monovalent hydrocarbon can be derived from removing one hydrogen atom from one carbon atom of a parent alkene. An alkenyl group can be branched, straight-chain, cyclic (e.g., cycloalkenyl), cis, or trans (e.g., E or Z). An exemplary alkenyl includes an optionally substituted $C_{2-24}$ alkyl group having one or more double bonds. The alkenyl group can be monovalent or multivalent (e.g., bivalent) by removing one or more hydrogens to form appropriate attachment to the parent molecular group or appropriate attachment between the parent molecular group and another substitution. The alkenyl group can also be substituted or unsubstituted. For example, the alkenyl group can be substituted with one or more substitution groups, as described herein for alkyl.

By "alkoxy" is meant —OR, where R is an optionally substituted alkyl group, as described herein. Exemplary alkoxy groups include methoxy, ethoxy, butoxy, trihaloalkoxy, such as trifluoromethoxy, etc. The alkoxy group can be substituted or unsubstituted. For example, the alkoxy group can be substituted with one or more substitution groups, as described herein for alkyl. Exemplary unsubstituted alkoxy groups include $C_{1-3}$, $C_{1-6}$, $C_{1-12}$, $C_{1-16}$, $C_{1-18}$, $C_{1-20}$, or $C_{1-24}$ alkoxy groups. By "alkyl" is meant a saturated monovalent hydrocarbon having at least one carbon atom to 50 carbon atoms ($C_{1-50}$), such as one to 25 carbon atoms ($C_{1-25}$), or one to ten carbon atoms ($C_{1-10}$), wherein the saturated monovalent hydrocarbon can be derived from removing one hydrogen atom from one carbon atom of a parent compound (e.g., alkane). An alkyl group can be branched, straight-chain, or cyclic (e.g., cycloalkyl). An exemplary alkyl includes a branched or unbranched saturated hydrocarbon group of 1 to 24 carbon atoms, such as methyl, ethyl, n-propyl, isopropyl, n-butyl, isobutyl, s-butyl, t-butyl, n-pentyl, isopentyl, s-pentyl, neopentyl, hexyl, heptyl, octyl, nonyl, decyl, dodecyl, tetradecyl, hexadecyl, eicosyl, tetracosyl, and the like. The alkyl group can also be substituted or unsubstituted. The alkyl group can be monovalent or multivalent (e.g., bivalent) by removing one or more hydrogens to form appropriate attachment to the parent molecular group or appropriate attachment between the parent molecular group and another substitution. For example, the alkyl group can be substituted with one, two, three or, in the case of alkyl groups of two carbons or more, four substituents independently selected from the group consisting of: (1) $C_{1-6}$ alkoxy (e.g., —O—R, in which R is $C_{1-6}$ alkyl); (2) $C_{1-6}$ alkylsulfinyl (e.g., —S(O)—R, in which R is $C_{1-6}$ alkyl); (3) $C_{1-6}$ alkylsulfonyl (e.g., —SO$_2$—R, in which R is $C_{1-6}$ alkyl); (4) amine (e.g., —C(O)NR$^1$R$^2$ or —NHCOR$^1$, where each of R$^1$ and R$^2$ is, independently, selected from hydrogen, aliphatic, heteroaliphatic, haloaliphatic, haloheteroaliphatic, aromatic, as defined herein, or any combination thereof, or R$^1$ and R$^2$, taken together with the nitrogen atom to which each are attached, form a heterocyclyl group, as defined herein); (5) aryl; (6) arylalkoxy (e.g., —O-L-R, in which L is alkyl and R is aryl); (7) aryloyl (e.g., —C(O)—R, in which R is aryl); (8) azido (e.g., —N$_3$); (9) cyano (e.g., —CN); (10) aldehyde (e.g., —C(O)H); (11) $C_{3-8}$ cycloalkyl; (12) halo; (13) heterocyclyl (e.g., as defined herein, such as a 5-, 6- or 7-membered ring containing one, two, three, or four non-carbon heteroatoms);

(14) heterocyclyloxy (e.g., —O—R, in which R is heterocyclyl, as defined herein); (15) heterocyclyloyl (e.g., —C(O)—R, in which R is heterocyclyl, as defined herein); (16) hydroxyl (e.g., —OH); (17) N-protected amino; (18) nitro (e.g., —NO$_2$); (19) oxo (e.g., =O); (20) C$_{1-6}$ thioalkoxy (e.g., —S—R, in which R is alkyl); (21) thiol (e.g., —SH); (22) —CO$_2$R$^1$, where R$^1$ is selected from the group consisting of (a) hydrogen, (b) C$_{1-6}$ alkyl, (c) C$_{4-18}$ aryl, and (d) C$_{1-6}$ alkyl-C$_{4-18}$ aryl (e.g., -L-R, in which L is C$_{1-6}$ alkyl and R is C$_{4-18}$ aryl); (23) —C(O)NR$^1$R$^2$, where each of R$^1$ and R$^2$ is, independently, selected from the group consisting of (a) hydrogen, (b) C$_{1-6}$ alkyl, (c) C$_{4-18}$ aryl, and (d) C$_{1-6}$ alkyl-C$_{4-18}$ aryl (e.g., -L-R, in which L is C$_{1-6}$ alkyl and R is C$_{4-18}$ aryl); (24) —SO$_2$R$^1$, where R$^1$ is selected from the group consisting of (a) C$_{1-6}$ alkyl, (b) C$_{4-18}$ aryl, and (c) C$_{1-6}$ alkyl-C$_{4-18}$ aryl (e.g., -L-R, in which L is C$_{1-6}$ alkyl and R is C$_{4-18}$ aryl); (25) —SO$_2$NR$^1$R$^2$, where each of R$^1$ and R$^2$ is, independently, selected from the group consisting of (a) hydrogen, (b) C$_{1-6}$ alkyl, (c) C$_{4-18}$ aryl, and (d) C$_{1-6}$ alkyl-C$_{4-18}$ aryl (e.g., -L-R, in which L is C$_{1-6}$ alkyl and R is C$_{4-18}$ aryl); (26) —SiR$^1$R$^2$R$^3$, where each of R$^1$ and R$^2$ and R$^3$ is, independently, selected from the group consisting of (a) hydrogen, (b) halo, such as F, Cl, Br, or I, (c) C$_{1-6}$ alkyl, (d) C$_{2-6}$ alkenyl, (e) C$_{2-6}$ alkynyl, or (f) C$_{1-6}$ alkoxy (e.g., —OR, in which R is C$_{1-6}$ alkyl); and (27) —NR$^1$R$^2$, where each of R$^1$ and R$^2$ is, independently, selected from the group consisting of (a) hydrogen, (b) an N-protecting group, (c) C$_{1-6}$ alkyl, (d) C$_{2-6}$ alkenyl, (e) C$_{2-6}$ alkynyl, (f) C$_{4-18}$ aryl, (g) C$_{1-6}$ alkyl-C$_{4-18}$ aryl (e.g., -L-R, in which L is C$_{1-6}$ alkyl and R is C$_{4-18}$ aryl), (h) C$_{3-8}$ cycloalkyl, and (i) C$_{1-6}$ alkyl-C$_{3-8}$ cycloalkyl (e.g., -L-R, in which L is C$_{1-6}$ alkyl and R is C$_{3-8}$ cycloalkyl), wherein in one embodiment no two groups are bound to the nitrogen atom through a carbonyl group or a sulfonyl group. The alkyl group can be a primary, secondary, or tertiary alkyl group substituted with one or more substituents (e.g., one or more halo or alkoxy). In some embodiments, the unsubstituted alkyl group is a C$_{1-3}$, C$_{1-6}$, C$_{1-12}$, C$_{1-16}$, C$_{1-18}$, C$_{1-20}$, or C$_{1-24}$ alkyl group.

By "alkynyl" is meant an unsaturated monovalent hydrocarbon having at least two carbon atom to 50 carbon atoms (C$_{2-50}$), such as two to 25 carbon atoms (C$_{2-25}$), or two to ten carbon atoms (C$_{2-10}$), and at least one carbon-carbon triple bond, wherein the unsaturated monovalent hydrocarbon can be derived from removing one hydrogen atom from one carbon atom of a parent alkyne. An alkynyl group can be branched, straight-chain, or cyclic (e.g., cycloalkynyl). An exemplary alkynyl includes an optionally substituted C$_{2-24}$ alkyl group having one or more triple bonds. The alkynyl group can be cyclic or acyclic and is exemplified by ethynyl, 1-propynyl, and the like. The alkynyl group can be monovalent or multivalent (e.g., bivalent) by removing one or more hydrogens to form appropriate attachment to the parent molecular group or appropriate attachment between the parent molecular group and another substitution. The alkynyl group can also be substituted or unsubstituted. For example, the alkynyl group can be substituted with one or more substitution groups, as described herein for alkyl.

By "amino" is meant —NR$^{N1}$R$^{N2}$, where each of R$^{N1}$ and R$^{N2}$ is, independently, H, optionally substituted alkyl, or optionally substituted aryl, or R$^{N1}$ and R$^{N2}$, taken together with the nitrogen atom to which each are attached, form a heterocyclyl group, as defined herein.

By "aminoalkyl" is meant an alkyl group, as defined herein, substituted by an amino group, as defined herein. Non-limiting aminoalkyl groups include -L-NR$^{N1}$R$^{N2}$, where L is a multivalent alkyl group, as defined herein; each of R$^{N1}$ and R$^{N2}$ is, independently, H, optionally substituted alkyl, or optionally substituted aryl; or R$^{N1}$ and R$^{N2}$, taken together with the nitrogen atom to which each are attached, form a heterocyclyl group, as defined herein.

By "aromatic" is meant a cyclic, conjugated group or moiety of, unless specified otherwise, from 5 to 15 ring atoms having a single ring (e.g., phenyl) or multiple condensed rings in which at least one ring is aromatic (e.g., naphthyl, indolyl, or pyrazolopyridinyl); that is, at least one ring, and optionally multiple condensed rings, have a continuous, delocalized π-electron system. Typically, the number of out of plane π-electrons corresponds to the Huckel rule (4n+2). The point of attachment to the parent structure typically is through an aromatic portion of the condensed ring system. Such an aromatic can be unsubstituted or substituted with one or more groups, such as groups described herein for an alkyl or aryl group. Yet other substitution groups can include aliphatic, haloaliphatic, halo, nitrate, cyano, sulfonate, sulfonyl, or others.

By "aryl" is meant an aromatic carbocyclic group comprising at least five carbon atoms to 15 carbon atoms (C$_{5-15}$), such as five to ten carbon atoms (C$_{5-10}$), having a single ring or multiple condensed rings, which condensed rings can or may not be aromatic provided that the point of attachment to a remaining position of the compounds disclosed herein is through an atom of the aromatic carbocyclic group. Aryl groups may be substituted with one or more groups other than hydrogen, such as aliphatic, heteroaliphatic, aromatic, other functional groups, or any combination thereof. Exemplary aryl groups include, but are not limited to, benzyl, naphthalene, phenyl, biphenyl, phenoxybenzene, and the like. The term aryl also includes heteroaryl, which is defined as a group that contains an aromatic group that has at least one heteroatom incorporated within the ring of the aromatic group. Examples of heteroatoms include, but are not limited to, nitrogen, oxygen, sulfur, and phosphorus. Likewise, the term non-heteroaryl, which is also included in the term aryl, defines a group that contains an aromatic group that does not contain a heteroatom. The aryl group can be substituted or unsubstituted. The aryl group can be substituted with one, two, three, four, or five substituents independently selected from the group consisting of: (1) C$_{1-6}$ alkanoyl (e.g., —C(O)—R, in which R is C$_{1-6}$ alkyl); (2) C$_{1-6}$ alkyl; (3) C$_{1-6}$ alkoxy (e.g., —O—R, in which R is C$_{1-6}$ alkyl); (4) C$_{1-6}$ alkoxy-C$_{1-6}$ alkyl (e.g., -L-O—R, in which each of L and R is, independently, C$_{1-6}$ alkyl); (5) C$_{1-6}$ alkylsulfinyl (e.g., —S(O)—R, in which R is C$_{1-6}$ alkyl); (6) C$_{1-6}$ alkylsulfinyl-C$_{1-6}$ alkyl (e.g., -L-S(O)—R, in which each of L and R is, independently, C$_{1-6}$ alkyl); (7) C$_{1-6}$ alkylsulfonyl (e.g., —SO$_2$—R, in which R is C$_{1-6}$ alkyl); (8) C$_{1-6}$ alkylsulfonyl-C$_{1-6}$ alkyl (e.g., -L-SO$_2$—R, in which each of L and R is, independently, C$_{1-6}$ alkyl); (9) aryl; (10) amine (e.g., —NR$^1$R$^2$, where each of R$^1$ and R$^2$ is, independently, selected from hydrogen, aliphatic, heteroaliphatic, haloaliphatic, haloheteroaliphatic, aromatic, as defined herein, or any combination thereof, or R$^1$ and R$^2$, taken together with the nitrogen atom to which each are attached, form a heterocyclyl group, as defined herein); (11) C$_{1-6}$ aminoalkyl (e.g., -L$^1$-NR$^1$R$^2$ or -L$^2$-C(NR$^1$R$^2$)(R$^3$)—R$^4$, in which L$^1$ is C$_{1-6}$ alkyl; L2 is a covalent bond or C$_{1-6}$ alkyl; each of R$^1$ and R$^2$ is, independently, selected from hydrogen, aliphatic, heteroaliphatic, haloaliphatic, haloheteroaliphatic, aromatic, as defined herein, or any combination thereof, or R$^1$ and R$^2$, taken together with the nitrogen atom to which each are attached, form a heterocyclyl group, as defined herein; and each of R$^3$ and R$^4$ is, independently, H or C$_{1-6}$ alkyl); (12) heteroaryl; (13) C$_{1-6}$ alkyl-C$_{4-18}$ aryl (e.g., -L-R, in which L is C$_{1-6}$ alkyl and R is C$_{4-18}$ aryl); (14) aryloyl (e.g., —C(O)—R, in which R is aryl); (15) azido (e.g., —N$_3$); (16) cyano (e.g., —CN); (17) C$_{1-6}$ azidoalkyl (e.g., -L-N$_3$, in which L is C$_{1-6}$ alkyl); (18) aldehyde (e.g., —C(O)H); (19) aldehyde-C$_{1-6}$ alkyl (e.g., -L-C(O)H, in which L is C$_{1-6}$ alkyl); (20) C$_{3-8}$ cycloalkyl; (21) C$_{1-6}$ alkyl-C$_{3-8}$ cycloalkyl (e.g., -L-R, in which L is C$_{1-6}$ alkyl and R is C$_{3-8}$ cycloalkyl); (22) halo; (23) C$_{1-6}$ haloalkyl (e.g., -L$^1$-X or -L$^2$-C(X)(R$^1$)—R$^2$, in which L$^1$ is C$_{1-6}$ alkyl; L$^2$ is a covalent bond or C$_{1-6}$ alkyl; X is fluoro, bromo, chloro, or iodo; and each of R$^1$ and R$^2$ is, independently, H or C$_{1-6}$ alkyl); (24) heterocyclyl (e.g., as defined herein, such as a 5-, 6- or 7-membered ring containing one, two, three, or four non-carbon heteroatoms); (25) heterocyclyloxy (e.g., —O—R, in which R is heterocyclyl, as defined herein); (26) heterocyclyloyl (e.g., —C(O)—R, in which R is heterocyclyl, as defined herein); (27) hydroxyl (—OH); (28) C$_{1-6}$ hydroxyalkyl (e.g., -L$^1$-OH or -L$^2$-C(OH)(R$^1$)—R$^2$, in which L$^1$ is C$_{1-6}$ alkyl; L$^2$ is a covalent bond or alkyl; and each of R$^1$ and R$^2$ is, independently, H or C$_{1-6}$ alkyl, as defined herein); (29) nitro; (30) C$_{1-6}$ nitroalkyl (e.g., -L$^1$-NO or -L$^2$-C(NO)(R$^1$)—R$^2$, in which L$^1$ is C$_{1-6}$ alkyl; L$^2$ is a covalent bond or alkyl; and each of R$^1$ and R$^2$ is, independently, H or C$_{1-6}$ alkyl, as defined herein); (31) N-protected amino; (32) N-protected amino-C$_{1-6}$ alkyl; (33) oxo (e.g., =O); (34) C$_{1-6}$ thioalkoxy (e.g., —S—R, in which R is C$_{1-6}$ alkyl); (35) thio-C$_{1-6}$ alkoxy-C$_{1-6}$ alkyl (e.g., -L-S—R, in which each of L and R is, independently, C$_{1-6}$ alkyl); (36) —(CH$_2$)$_r$CO$_2$R$^1$, where r is an integer of from zero to four, and R$^1$ is selected from the group consisting of (a) hydrogen, (b) C$_{1-6}$ alkyl, (c) C$_{4-18}$ aryl, and (d) C$_{1-6}$ alkyl-C$_{4-18}$ aryl (e.g., -L-R, in which L is C$_{1-6}$ alkyl and R is C$_{4-18}$ aryl); (37) —(CH$_2$)$_r$CONR$^1$R$^2$, where r is an integer of from zero to four and where each R$^1$ and R$^2$ is independently selected from the group consisting of (a) hydrogen, (b) C$_{1-6}$ alkyl, (c) C$_{4-18}$ aryl, and (d) C$_{1-6}$ alkyl-C$_{4-18}$ aryl (e.g., -L-R, in which L is C$_{1-6}$ alkyl and R is C$_{4-18}$ aryl); (38) —(CH$_2$)$_r$SO$_2$R$^1$, where r is an integer of from zero to four and where R$^1$ is selected from the group consisting of (a) C$_{1-6}$ alkyl, (b) C$_{4-18}$ aryl, and (c) C$_{1-6}$ alkyl-C$_{4-18}$ aryl (e.g., -L-R, in which L is C$_{1-6}$ alkyl and R is C$_{4-18}$ aryl); (39) —(CH$_2$)$_r$SO$_2$NR$^1$R$^2$, where r is an integer of from zero to four and where each of R$^1$ and R$^2$ is, independently, selected from the group consisting of (a) hydrogen, (b) C$_{1-6}$ alkyl, (c) C$_{4-18}$ aryl, and (d) C$_{1-6}$ alkyl-C$_{4-18}$ aryl (e.g., -L-R, in which L is C$_{1-6}$ alkyl and R is C$_{4-18}$ aryl); (40) —(CH$_2$)$_r$NR$^1$R$^2$, where r is an integer of from zero to four and where each of R$^1$ and R$^2$ is, independently, selected from the group consisting of (a) hydrogen, (b) an N-protecting group, (c) C$_{1-6}$ alkyl, (d) C$_{2-6}$ alkenyl, (e) C$_{2-6}$ alkynyl, (f) C$_{4-18}$ aryl, (g) C$_{1-6}$ alkyl-C$_{4-18}$ aryl (e.g., -L-R, in which L is C$_{1-6}$ alkyl and R is C$_{4-18}$ aryl), (h) C$_{3-8}$ cycloalkyl, and (i) C$_{1-6}$ alkyl-C$_{3-8}$ cycloalkyl (e.g., -L-R, in which L is C$_{1-6}$ alkyl and R is C$_{3-8}$ cycloalkyl), wherein in one embodiment no two groups are bound to the nitrogen atom through a carbonyl group or a sulfonyl group; (41) thiol (e.g., —SH); (42) perfluoroalkyl (e.g., —(CF$_2$)$_n$CF$_3$, in which n is an integer from 0 to 10); (43) perfluoroalkoxy (e.g., —O—(CF$_2$)$_n$CF$_3$, in which n is an integer from 0 to 10); (44) aryloxy (e.g., —O—R, in which R is aryl); (45) cycloalkoxy (e.g., —O—R, in which R is cycloalkyl); (46) cycloalkylalkoxy (e.g., —O-L-R, in which L is alkyl and R is cycloalkyl); (47) arylalkoxy (e.g., —O-L-R, in which L is alkyl and R is aryl); and (48) —SiR$^1$R$^2$R$^3$, where each of R$^1$ and R$^2$ and R$^3$ is, independently, selected from the group consisting of (a) hydrogen, (b) halo, such as F, Cl, Br, or I, (c) C$_{1-6}$ alkyl, (d) C$_{2-6}$ alkenyl, (e) C$_{2-6}$ alkynyl, or (f) C$_{1-6}$ alkoxy (e.g., —OR, in which R is C$_{1-6}$ alkyl). In particular embodiments, an unsubstituted aryl group is a C$_{4-18}$, C$_{4-14}$, C$_{4-12}$, C$_{4-10}$, C$_{6-18}$, C$_{6-14}$, C$_{6-12}$, or C$_{6-10}$ aryl group.

By "cycloaliphatic" is meant an aliphatic group, as defined herein, that is cyclic. Such cycloaliphatic groups can be saturated or unsaturated.

By "cycloalkyl" is meant a monovalent saturated or unsaturated non-aromatic cyclic hydrocarbon group of from three to eight carbons, unless otherwise specified, and is exemplified by cyclopropyl, cyclobutyl, cyclopentyl, cyclohexyl, cycloheptyl, bicyclo[2.2.1.heptyl], and the like. The cycloalkyl group can also be substituted or unsubstituted. For example, the cycloalkyl group can be substituted with one or more groups including those described herein for alkyl.

By "cycloheteroaliphatic" is meant a heteroaliphatic group, as defined herein, that is cyclic. Such cycloheteroaliphatic groups can be saturated or unsaturated.

By "cycloheteroalkyl" is meant a monovalent saturated or unsaturated non-aromatic cyclic hydrocarbon group of from three to eight carbons and having at least one heteroatom, which can be selected from, but not limited to oxygen, nitrogen, sulfur, silicon, boron, selenium, phosphorous, and oxidized forms thereof within the group. The cycloheteroalkyl group can also be substituted or unsubstituted. For example, the cycloheteroalkyl group can be substituted with one or more groups including those described herein for alkyl.

By "halo" is meant fluoro (F), chloro (Cl), bromo (Br), or iodo (I).

By "haloalkyl" is meant an alkyl group, as defined herein, substituted with one or more halo.

By "heteroaliphatic" is meant an aliphatic group, as defined herein, including at least one heteroatom to 20 heteroatoms, such as one to 15 heteroatoms, or one to 5 heteroatoms, which can be selected from, but not limited to oxygen, nitrogen, sulfur, silicon, boron, selenium, phosphorous, and oxidized forms thereof within the group.

By "heteroalkyl," "heteroalkenyl," and "heteroalkynyl" is meant an alkyl, alkenyl, or alkynyl group (which can be branched, straight-chain, or cyclic), respectively, as defined herein, including at least one heteroatom to 20 heteroatoms, such as one to 15 heteroatoms, or one to 5 heteroatoms, which can be selected from, but not limited to, oxygen, nitrogen, sulfur, silicon, boron, selenium, phosphorous, and oxidized forms thereof within the group. The heteroalkyl, heteroalkenyl, and/or heteroalkynyl groups can also be substituted or unsubstituted. For example, the heteroalkyl, heteroalkenyl, and/or heteroalkynyl groups can be substituted with one or more groups including those described herein for alkyl.

By "heterocyclyl" is meant a 3-, 4-, 5-, 6- or 7-membered ring (e.g., a 5-, 6- or 7-membered ring), unless otherwise specified, containing one, two, three, or four non-carbon heteroatoms (e.g., independently selected from the group consisting of nitrogen, oxygen, phosphorous, sulfur, selenium, silicon, boron, or halo). The 3-membered ring has zero to one double bonds, the 4- and 5-membered ring has zero to two double bonds, and the 6- and 7-membered rings have zero to three double bonds. The term "heterocyclyl" also includes bicyclic, tricyclic and tetracyclic groups in which any of the above heterocyclic rings is fused to one, two, or three rings independently selected from the group consisting of an aryl ring, a cyclohexane ring, a cyclohexene ring, a cyclopentane ring, a cyclopentene ring, and another monocyclic heterocyclic ring, such as indolyl, quinolyl, isoquinolyl, tetrahydroquinolyl, benzofuryl, benzothienyl and the like. Heterocyclics include acridinyl, adenyl, alloxazinyl, azaadamantanyl, azabenzimidazolyl, azabicyclononyl, azacycloheptyl, azacyclooctyl, azacyclononyl, azahypoxanthinyl, azaindazolyl, azaindolyl, azecinyl, azepanyl, azepinyl, azetidinyl, azetyl, aziridinyl, azirinyl, azocanyl, azocinyl, azonanyl, benzimidazolyl, benzisothiazolyl, benzisoxazolyl, benzodiazepinyl, benzodiazocinyl, benzodihydrofuryl, benzodioxepinyl, benzodioxinyl, benzodioxanyl, benzodioxocinyl, benzodioxolyl, benzodithiepinyl, benzodithiinyl, benzodioxocinyl, benzofuranyl, benzophenazinyl, benzopyranonyl, benzopyranyl, benzopyrenyl, benzopyronyl, benzoquinolinyl, benzoquinolizinyl, benzothiadiazepinyl, benzothiadiazolyl, benzothiazepinyl, benzothiazocinyl, benzothiazolyl, benzothienyl, benzothiophenyl, benzothiazinonyl, benzothiazinyl, benzothiopyranyl, benzothiopyronyl, benzotriazepinyl, benzotriazinonyl, benzotriazinyl, benzotriazolyl, benzoxathiinyl, benzotrioxepinyl, benzoxadiazepinyl, benzoxathiazepinyl, benzoxathiepinyl, benzoxathiocinyl, benzoxazepinyl, benzoxazinyl, benzoxazocinyl, benzoxazolinonyl, benzoxazolinyl, benzoxazolyl, benzylsultamyl benzylsultimyl, bipyrazinyl, bipyridinyl, carbazolyl (e.g., 4H-carbazolyl), carbolinyl (e.g., (3-carbolinyl), chromanonyl, chromanyl, chromenyl, cinnolinyl, coumarinyl, cytdinyl, cytosinyl, decahydroisoquinolinyl, decahydroquinolinyl, diazabicyclooctyl, diazetyl, diaziridinethionyl, diaziridinonyl, diaziridinyl, diazirinyl, dibenzisoquinolinyl, dibenzoacridinyl, dibenzocarbazolyl, dibenzofuranyl, dibenzophenazinyl, dibenzopyranonyl, dibenzopyronyl (xanthonyl), dibenzoquinoxalinyl, dibenzothiazepinyl, dibenzothiepinyl, dibenzothiophenyl, dibenzoxepinyl, dihydroazepinyl, dihydroazetyl, dihydrofuranyl, dihydrofuryl, dihydroisoquinolinyl, dihydropyranyl, dihydropyridinyl, dihydroypyridyl, dihydroquinolinyl, dihydrothienyl, dihydroindolyl, dioxanyl, dioxazinyl, dioxindolyl, dioxiranyl, dioxenyl, dioxinyl, dioxobenzofuranyl, dioxolyl, dioxotetrahydrofuranyl, dioxothiomorpholinyl, dithianyl, dithiazolyl, dithienyl, dithiinyl, furanyl, furazanyl, furoyl, furyl, guaninyl, homopiperazinyl, homopiperidinyl, hypoxanthinyl, hydantoinyl, imidazolidinyl, imidazolinyl, imidazolyl, indazolyl (e.g., 1H-indazolyl), indolenyl, indolinyl, indolizinyl, indolyl (e.g., 1H-indolyl or 3H-indolyl), isatinyl, isatyl, isobenzofuranyl, isochromanyl, isochromenyl, isoindazoyl, isoindolinyl, isoindolyl, isopyrazolonyl, isopyrazolyl, isoxazolidiniyl, isoxazolyl, isoquinolinyl, isoquinolinyl, isothiazolidinyl, isothiazolyl, morpholinyl, naphthindazolyl, naphthindolyl, naphthiridinyl, naphthopyranyl, naphthothiazolyl, naphthothioxolyl, naphthotriazolyl, naphthoxindolyl, naphthyridinyl, octahydroisoquinolinyl, oxabicycloheptyl, oxauracil, oxadiazolyl, oxazinyl, oxaziridinyl, oxazolidinyl, oxazolidonyl, oxazolinyl, oxazolonyl, oxazolyl, oxepanyl, oxetanonyl, oxetanyl, oxetyl, oxtenayl, oxindolyl, oxiranyl, oxobenzoisothiazolyl, oxochromenyl, oxoisoquinolinyl, oxoquinolinyl, oxothiolanyl, phenanthridinyl, phenanthrolinyl, phenazinyl, phenothiazinyl, phenothienyl (benzothiofuranyl), phenoxathiinyl, phenoxazinyl, phthalazinyl, phthalazonyl, phthalidyl, phthalimidinyl, piperazinyl, piperidinyl, piperidonyl (e.g., 4-piperidonyl), pteridinyl, purinyl, pyranyl, pyrazinyl, pyrazolidinyl, pyrazolinyl, pyrazolopyrimidinyl, pyrazolyl, pyridazinyl, pyridinyl, pyridopyrazinyl, pyridopyrimidinyl, pyridyl, pyrimidinyl, pyrimidyl, pyronyl, pyrrolidinyl, pyrrolidonyl (e.g., 2-pyrrolidonyl), pyrrolinyl, pyrrolizidinyl, pyrrolyl (e.g., 2H-pyrrolyl), pyrylium, quinazolinyl, quinolinyl, quinolizinyl (e.g., 4H-quinolizinyl), quinoxalinyl, quinuclidinyl, selenazinyl, selenazolyl, selenophenyl, succinimidyl, sulfolanyl, tetrahydrofuranyl, tetrahydrofuryl, tetrahydroisoquinolinyl, tetrahydroisoquinolyl, tetrahydropyridinyl, tetrahydropyridyl (piperidyl), tetrahydropyranyl, tetrahydropyronyl, tetrahydroquinolinyl, tetrahydroquinolyl, tetrahydrothienyl, tetrahydrothiophenyl, tetrazinyl, tetrazolyl, thiadiazinyl (e.g., 6H-1,2,5-thiadiazinyl or 2H,6H-1,5,2-dithiazinyl), thiadiazolyl, thianthrenyl, thianyl, thianaphthenyl, thiazepinyl, thiazinyl, thiazolidinedionyl, thiazolidinyl, thiazolyl, thienyl, thiepanyl, thiepinyl, thietanyl, thietyl, thiiranyl, thiocanyl, thiochromanonyl, thiochromanyl, thiochromenyl, thiodiazinyl, thiodiazolyl, thioindoxyl, thiomorpholinyl, thiophenyl, thiopyranyl, thiopyronyl, thiotriazolyl, thiourazolyl, thioxanyl, thioxolyl, thymidinyl, thyminyl, triazinyl, triazolyl, trithianyl, urazinyl, urazolyl, uretidinyl, uretinyl, uricyl, uridinyl, xanthenyl, xanthinyl, xanthionyl, and the like, as well as modified forms thereof (e.g., including one or more oxo and/or amino) and salts thereof. The heterocyclyl group can be substituted or unsubstituted. For example, the heterocyclyl group can be substituted with one or more substitution groups, as described herein for aryl.

By "thioalkoxy" is meant an —SR group, wherein R is an optionally substituted alkyl group, as defined herein. Exemplary unsubstituted thioalkoxy groups include $C_{1-6}$ thioalkoxy.

A person of ordinary skill in the art would recognize that the definitions provided above are not intended to include impermissible substitution patterns (e.g., methyl substituted with 5 different groups, and the like). Such impermissible substitution patterns are easily recognized by a person of ordinary skill in the art. Any functional group disclosed herein and/or defined above can be substituted or unsubstituted, unless otherwise indicated therein.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method for processing substrates, the method comprising:
   providing a substrate having a silicon-and-nitrogen-containing surface and a silicon-and-oxygen-containing surface;
   exposing the substrate to a carbon-containing self-assembled monolayer precursor in a non-plasma environment such that the carbon-containing self-assembled monolayer precursor selectively attaches to the silicon-and-nitrogen-containing surface to form a protected surface and a non-functionalized surface; and
   exposing the substrate comprising the protected surface to a process for etching the non-functionalized surface.

2. The method of claim 1, wherein the protected surface comprises a protected silicon-and-nitrogen-containing surface, and wherein the non-functionalized surface comprises a non-functionalized silicon-and-oxygen-containing surface.

3. The method of claim 1, wherein the carbon-containing self-assembled monolayer precursor comprises a head group having greater reactivity with the silicon-and-nitrogen-containing surface relative to the silicon-and-oxygen-containing surface.

4. The method of claim 1, wherein the carbon-containing self-assembled monolayer precursor comprises:

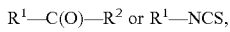

wherein $R^1$ comprises an organic moiety, and
wherein $R^2$ is hydrogen (H) or an organic moiety.

5. The method of claim 4, wherein each of $R^1$ and/or $R^2$ is or comprises, independently, optionally substituted aliphatic, optionally substituted heteroaliphatic, optionally substituted cycloaliphatic, optionally substituted cycloheteroaliphatic, or optionally substituted aromatic.

6. The method of claim 1, wherein the carbon-containing self-assembled monolayer precursor is selected from the group consisting of an aldehyde, an isothiocyanate, benzaldehyde, a derivative of benzaldehyde with one or more fluorine atoms substituted for hydrogen atoms, 1-hexanal, 3,5,5-trimethylhexanal phenyl isothiocyanate, and hexyl isothiocyanate.

7. The method of claim 1, further comprising repeating exposing the substrate to the carbon-containing self-assembled monolayer precursor after the exposing the substrate to the process for etching the non-functionalized surface.

8. The method of claim 1, wherein the exposing the substrate to the process for etching the non-functionalized surface comprises performing atomic layer etching and/or continuous etching.

9. The method of claim 1, wherein the exposing the substrate to the process for etching the non-functionalized surface comprises:
exposing the substrate to a plasma reactive species generated from a fluorocarbon plasma to form a reactive layer; and
exposing the substrate to an activation plasma to remove the reactive layer.

10. The method of claim 9, further comprising repeating exposing the substrate to the plasma reactive species and exposing the substrate to the activation plasma in cycles.

11. The method of claim 9, wherein the fluorocarbon plasma is generated from a fluorocarbon selected from the group consisting of $C_4F_6$, $C_4F_8$, a perfluorocarbon, a fluorohydrocarbon, and combinations thereof; and/or wherein the activation plasma comprises argon, helium, or an inert gas.

12. The method of claim 9, wherein the exposing of the substrate to the plasma reactive species and exposing the substrate to the activation plasma are performed in temporally separated alternating pulses.

13. The method of claim 1, wherein the exposing the substrate to the carbon-containing self-assembled monolayer precursor is performed at a wafer temperature between about −40° C. and about 550° C.; and/or performed with a dose between about 0.1 ML and about 500 ML.

14. The method of claim 1, wherein the exposing the substrate to the carbon-containing self-assembled monolayer precursor and the exposing the substrate to the process are performed without breaking vacuum.

15. The method of claim 14, wherein the process comprises introducing a fluorocarbon plasma.

16. The method of claim 1, further comprising prior to exposing the substrate to the carbon-containing self-assembled monolayer precursor, exposing the substrate to a treatment gas in a plasma environment.

17. The method of claim 16, wherein the treatment gas is selected from the group consisting of argon, nitrogen, hydrogen, helium, and combinations thereof.

18. The method of claim 16, wherein the exposing the substrate to the treatment gas in the plasma environment comprises applying an RF bias.

19. The method of claim 1, wherein the protected surface prevents activation of the non-functionalized surface when exposed to argon plasma.

20. The method of claim 1, wherein the silicon-and-nitrogen-containing surface comprises material selected from the group consisting of silicon oxynitride, silicon carbonitride, hydrogen-terminated silicon nitride, dopant versions thereof, and combinations thereof.

21. The method of claim 1, wherein the silicon-and-nitrogen-containing surface comprises —NHx groups.

22. The method of claim 1, wherein the silicon-and-oxygen-containing surface comprises a low-k dielectric.

23. The method of claim 1, wherein the silicon-and-nitrogen-containing surface comprises a first sidewall surface, the silicon-and-oxygen-containing surface comprises a second sidewall surface, and the protected surface comprises a protected sidewall surface; and wherein the process for etching comprises vertical etching through a feature comprising the first sidewall surface and the second sidewall surface.

24. The method of claim 23, wherein the feature has an aspect ratio of at least about 20:1.

* * * * *